(12) United States Patent
Choi et al.

(10) Patent No.: US 12,525,592 B2
(45) Date of Patent: Jan. 13, 2026

(54) DISPLAY DEVICE AND METHOD OF MANUFACTURING THE SAME

(71) Applicant: Samsung Display Co., LTD., Yongin-si (KR)

(72) Inventors: Nak Cho Choi, Yongin-si (KR); Sang Woo An, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 662 days.

(21) Appl. No.: 17/893,580

(22) Filed: Aug. 23, 2022

(65) Prior Publication Data

US 2023/0246011 A1      Aug. 3, 2023

(30) Foreign Application Priority Data

Jan. 20, 2022   (KR) ........................ 10-2022-0008790

(51) Int. Cl.
*H01L 25/16*       (2023.01)
*H01L 23/00*       (2006.01)
(Continued)

(52) U.S. Cl.
CPC ........ *H01L 25/167* (2013.01); *H01L 23/3192* (2013.01); *H01L 24/05* (2013.01);
(Continued)

(58) Field of Classification Search
CPC ..... H01L 24/08; H01L 23/3192; H01L 24/05; H01L 25/167; H01L 24/13; H01L 24/95; H01L 25/0753; H01L 24/16; H01L 24/48; H01L 24/85; H01L 24/45; H01L 25/105; H01L 2224/05664; H01L 2224/13023; H01L 2224/16225; H01L 2224/95001;
(Continued)

(56) References Cited

U.S. PATENT DOCUMENTS 9,818,725 B2    11/2017   Bower et al.
9,911,722 B2     3/2018   Higginson et al.
(Continued)

FOREIGN PATENT DOCUMENTS

KR       10-1462845       11/2014
KR       10-1595696        2/2016
(Continued)

*Primary Examiner* — Mouloucoulaye Inoussa
(74) *Attorney, Agent, or Firm* — CANTOR COLBURN LLP

(57) ABSTRACT

A method of manufacturing a display device includes forming a thin film transistor layer in an active area of a substrate, forming a metal layer on an edge area of the substrate, transferring first coating patterns to the edge area, the first coating patterns covering a portion of the metal layer corresponding to shapes of side surface lines, etching the metal layer to form the side surface lines, an upper surface of each of the side surface lines being covered by the first coating patterns, transferring a second coating pattern to the edge area, the second coating pattern covering a side surface of each of the side surface lines and the first coating patterns, and transferring light emitting elements to the thin film transistor layer. The second coating pattern includes openings corresponding to the first coating patterns in a plan view.

20 Claims, 36 Drawing Sheets

(51) Int. Cl.
*H01L 23/31* (2006.01)
*H10D 86/01* (2025.01)
*H10D 86/40* (2025.01)
*H10D 86/60* (2025.01)
*H10H 20/857* (2025.01)

(52) U.S. Cl.
CPC .............. *H01L 24/08* (2013.01); *H01L 24/13* (2013.01); *H01L 24/16* (2013.01); *H01L 24/95* (2013.01); *H10D 86/0221* (2025.01); H01L 24/06 (2013.01); H01L 24/17 (2013.01); H01L 2224/05082 (2013.01); H01L 2224/05124 (2013.01); H01L 2224/05139 (2013.01); H01L 2224/05147 (2013.01); H01L 2224/05164 (2013.01); H01L 2224/05166 (2013.01); H01L 2224/05186 (2013.01); H01L 2224/05558 (2013.01); H01L 2224/05572 (2013.01); H01L 2224/05573 (2013.01); H01L 2224/05639 (2013.01); H01L 2224/05647 (2013.01); H01L 2224/05664 (2013.01); H01L 2224/05666 (2013.01); H01L 2224/05686 (2013.01); H01L 2224/06181 (2013.01); H01L 2224/08145 (2013.01); H01L 2224/13023 (2013.01); H01L 2224/16145 (2013.01); H01L 2224/16225 (2013.01); H01L 2224/17181 (2013.01); H01L 2224/95001 (2013.01); H01L 2924/0133 (2013.01); H01L 2924/0549 (2013.01); H01L 2924/12041 (2013.01); *H10D 86/411* (2025.01); *H10D 86/441* (2025.01); *H10D 86/60* (2025.01); *H10H 20/857* (2025.01)

(58) Field of Classification Search
CPC . H01L 2924/12041; H01L 2224/05139; H01L 2224/05647; H01L 2224/05639; H01L 2224/05666; H01L 2224/16145; H01L 2924/0133; H01L 2224/05082; H01L 2224/05558; H01L 2224/05686; H01L 2224/05573; H01L 2224/05164; H01L 2224/06181; H01L 2924/0132; H01L 2224/48992; H01L 2224/04042; H01L 2224/0568; H01L 2224/08145; H01L 2224/45124; H10D 86/0221; H10D 86/411; H10H 20/857; H10H 20/8506; G09G 3/3648; H10K 59/1213; H10K 59/131; H10K 59/18; G09F 9/30; H04M 1/0277; H04M 1/22; H04M 1/0202; H05K 1/181; H05K 3/28; H05K 1/111; H05K 3/403; H05K 2201/10106; H01K 2201/09154; F21Y 2115/10
See application file for complete search history.

(56) References Cited

U.S. PATENT DOCUMENTS

| | | |
|---|---|---|
| 11,056,630 B2 | 7/2021 | Hong et al. |
| 11,600,240 B2 | 3/2023 | Yokoyama et al. |
| 12,148,862 B2 | 11/2024 | Jeon et al. |
| 12,324,294 B2 | 6/2025 | Kwon et al. |
| 2020/0013803 A1* | 1/2020 | Jang ...................... H10D 86/441 |
| 2020/0013846 A1* | 1/2020 | Kwon .................. H10K 59/131 |
| 2020/0091446 A1* | 3/2020 | Seo ........................ H10K 77/10 |
| 2020/0135126 A1* | 4/2020 | Yokoyama ........... G09G 3/3648 |
| 2020/0203235 A1* | 6/2020 | Jung ...................... H10D 86/60 |
| 2020/0259056 A1* | 8/2020 | Hong .................... H01L 25/167 |
| 2021/0183897 A1* | 6/2021 | Qi ........................ H10D 86/0231 |
| 2021/0202630 A1* | 7/2021 | Jeon ..................... H10K 50/844 |
| 2021/0202906 A1* | 7/2021 | Kim ...................... H10K 59/873 |
| 2021/0366378 A1* | 11/2021 | Zhao ...................... G09F 9/302 |
| 2022/0007504 A1* | 1/2022 | Chen ................... H10K 59/131 |
| 2022/0052241 A1* | 2/2022 | Lu ........................ H10H 29/142 |
| 2022/0053646 A1* | 2/2022 | Cheng ................. H04M 1/0277 |
| 2022/0077272 A1* | 3/2022 | Jeong .................. H10K 59/131 |
| 2022/0102477 A1* | 3/2022 | Sim ..................... H10K 59/131 |
| 2022/0208909 A1* | 6/2022 | Jeon ...................... G09F 9/3026 |
| 2022/0238465 A1* | 7/2022 | Hosaka ............... H01L 25/0657 |
| 2022/0320056 A1* | 10/2022 | Liang ..................... H01L 24/48 |
| 2023/0005962 A1* | 1/2023 | Lee ..................... H01L 25/0753 |

FOREIGN PATENT DOCUMENTS

| | | |
|---|---|---|
| KR | 1020190116198 A | 10/2019 |
| KR | 1020200004402 A | 1/2020 |
| KR | 1020200099066 A | 8/2020 |
| KR | 102179672 B1 | 11/2020 |
| KR | 1020210079588 A | 6/2021 |

* cited by examiner

FIG. 1
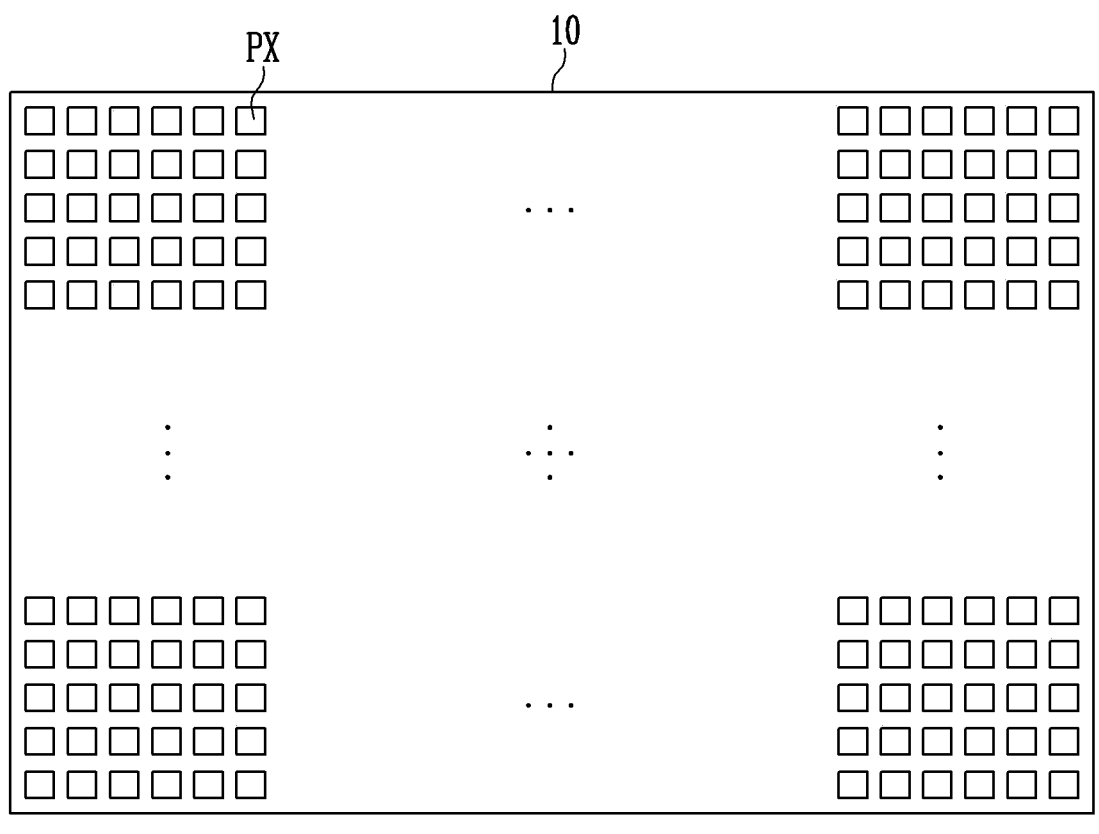
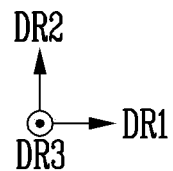

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0008790 under 35 U.S.C. § 119, filed Jan. 20, 2022, in the Korean Intellectual Property Office, the entire contents of which are incorporated herein by reference.

BACKGROUND

1. Technical Field

The disclosure relates to a display device and a method of manufacturing the same.

2. Description of the Related Art

As interest in information displays has increased, research and development on a display device has progressed. For example, in order to make large screen display devices, tiled display devices in which multiple display devices are connected are becoming available. Tiled display devices implement large screens by fixing multiple display panels to a mount frame.

Since the substrate of the display panel used in tiled display devices connects a pad formed on a front surface and a pad (or a connection line) formed on a rear surface through a side surface line, a coating pattern surrounding a side surface of the substrate is required to protect from moisture and oxygen the side surface line which may be exposed to the outside and to prevent the side surface line from being visible to a user.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

A technical object to be addressed by the embodiments is to provide a display device and a method of manufacturing the display device that prevents contact failures due to the coating pattern in a process of transferring light emitting elements to a substrate.

However, the objects of the disclosure are not limited to these objects, and may be include other objects without departing from the spirit and scope of the disclosure.

According to embodiments of the disclosure, a method of manufacturing a display device may include forming a thin film transistor layer in an active area of a substrate, forming a metal layer on an edge area of the substrate, transferring first coating patterns to the edge area, the first coating patterns covering a portion of the metal layer corresponding to shapes of side surface lines, etching the metal layer to form the side surface lines, an upper surface of each of the side surface lines being covered by the first coating patterns, transferring a second coating pattern to the edge area, the second coating pattern covering a side surface of each of the side surface lines and the first coating patterns, and transferring light emitting elements to the thin film transistor layer. The second coating pattern may include openings corresponding to the first coating patterns in a plan view.

A height from a surface of the substrate to an upper surface of the first coating pattern and a height from the surface of the substrate to an upper surface of the second coating pattern may be substantially a same height.

The height from the surface of the substrate to the upper surface of the second coating pattern at an edge portion of the first coating pattern may be higher than the height from the surface of the substrate to the upper surface of the first coating pattern.

The edge area may include a first area corresponding to a side surface of the substrate, a second area corresponding to a front surface of the substrate adjacent to the first area, and a third area corresponding to a rear surface of the substrate adjacent to the first area.

A first chamfer surface may be disposed at an edge of the substrate where the first area contacts the second area, and a second chamfer surface may be disposed at an edge of the substrate where the first area contacts the third area.

The forming the thin film transistor layer may include forming a pad electrically connected to a signal line of the thin film transistor layer in the second area and forming a connection line electrically connected to an external driver in the third area.

A side surface line among the side surface lines may physically and electrically connect the pad and the connection line.

The metal layer may be integrally formed in the edge area by a sputtering process.

The transferring the first coating patterns may include preparing a first plate having first concave portions, the first concave portions disposed in a same pattern as the first coating patterns, applying an ink to the first concave portions to form first coating ribbons, transferring the first coating ribbons to a first printing pad by pressing the first printing pad against the first plate, and transferring the first coating ribbons to the edge area through a pad printing process using the first printing pad to form the first coating pattern.

The transferring the second coating patterns may include preparing a second plate having integral second concave portions, the integral second concave portions disposed in a same pattern as the second coating patterns, applying the ink to the second concave portions for form second coating ribbons, transferring the second coating ribbons to a second printing pad by pressing the second printing pad against the second plate, and transferring the second coating ribbons to the edge area through a pad printing process using the second printing pad to form the second coating pattern.

The ink may include a photoresist and a black pigment.

The black pigment may include at least one of carbon black and titanium black.

Transferring the light emitting elements may use a stamp method using an elastic polymer material such as polydimethylsiloxane (PDMS) or silicone as a transfer substrate.

A height from a surface of the substrate to a surface of the transfer substrate may be higher than a height from the surface of the substrate to an upper surface of the second coating pattern.

According to embodiments of the disclosure, a display device includes, light emitting elements disposed on an active area of a substrate, pads disposed on a front surface edge area of the substrate, the pads being electrically connected to the light emitting elements, connection lines disposed on a rear surface edge area of the substrate, and side surface lines electrically connecting the pads and the connection lines through a side surface of the substrate. An upper surface of the side surface lines is covered by first coating pattern, a side surface of the side surface lines is covered by a second coating pattern. The second coating pattern includes openings corresponding to the first coating patterns in a plan view.

A height from a surface of the substrate to an upper surface of the first coating pattern and a height from the surface of the substrate to an upper surface of the second coating pattern may be substantially a same height.

The height from the surface of the substrate to the upper surface of the second coating pattern at an edge portion of the first coating pattern may be higher than the height from the surface of the substrate to the upper surface of the first coating pattern.

A first chamfer surface may be disposed at an edge where a front surface contacts the side surface of the substrate, and a second chamfer surface may be disposed at an edge where a rear surface of the substrate contacts the side surface of the substrate.

A height from a surface of the substrate to an upper surface of the light emitting element may be higher than a height from the surface of the substrate to an upper surface of the second coating pattern.

The first coating pattern and the second coating pattern may include a photoresist and a black pigment.

Light emitting elements may be micro light emitting diodes of a flip chip type.

Micro light emitting diodes may comprise a base substrate, an n-type semiconductor disposed on the base substrate, an active layer disposed on a first portion of the n-type semiconductor, a p-type semiconductor disposed on a surface of the active layer, a first contact electrode disposed on the p-type semiconductor, and a second contract electrode disposed on a second portion of the n-type semiconductor.

According to embodiments of the disclosure, a tiled display may comprise display devices, each of the display devices comprising a substrate, light emitting elements disposed on an active area of the substrate, pads disposed on a front surface edge area of the substrate, the pads being electrically connected to the light emitting elements, connection lines disposed on a rear surface edge area of the substrate, and side surface lines electrically connecting respective ones of the pads and the connection lines through a side surface of the substrate, wherein an upper surface of the side surface lines is covered by first coating patterns, and a side surface of the side surface lines is covered by a second coating pattern, and wherein the second coating pattern includes openings corresponding to the first coating patterns in a plan view.

Display devices may be arranged in a matrix form.

Display devices may comprise a first display device, a second display device, a third display device and a fourth display device, and wherein the first display device and the second display device may be adjacent to each other in a first direction, the first display device and the third display device may be adjacent to each other in a second direction intersecting the first direction, the third display device and the fourth display device may be adjacent to each other in the first direction, and the second display device and the fourth display device may be adjacent to each other in the second direction.

Display devices may be connected to each other by a coupling member or an adhesive member.

A height from a surface of the substrate to an upper surface of the first coating pattern and a height from the surface of the substrate to an upper surface of the second coating pattern may be substantially a same height.

A height from the surface of the substrate to the upper surface of the second coating pattern at an edge portion of the first coating patterns may be higher than a height from the surface of the substrate to the upper surface of the first coating pattern.

A first chamfer surface may be disposed at an edge where a front surface of the substrate contacts the side surface of the substrate, and a second chamfer surface may be disposed at an edge where a rear surface of the substrate contacts the side surface of the substrate.

A height from a surface of the substrate to an upper surface of the light emitting elements may be higher than a height from the surface of the substrate to an upper surface of the second coating pattern.

The first coating patterns and a second coating pattern may include a photoresist and a black pigment.

Light emitting elements may be micro light emitting diodes of a flip chip type.

Micro light emitting diodes may comprise a base substrate, an n-type semiconductor disposed on the base substrate, an active layer disposed on a first portion of the n-type semiconductor, a p-type semiconductor disposed on a surface of the active layer, a first contact electrode disposed on the p-type semiconductor, and a second contract electrode disposed on a second portion of the n-type semiconductor.

In the display device and the method of manufacturing the same according to an embodiment of the disclosure, contact failure may be prevented in a process of transferring the light emitting elements to the substrate by reducing a thickness of a coating pattern.

However, an effect of the disclosure is not limited to the above-described effect, and may be variously expanded without departing from the spirit and scope of the disclosure.

BRIEF DESCRIPTION OF THE DRAWINGS

The above and other features of the disclosure will become more apparent by describing in further detail embodiments thereof with reference to the accompanying drawings, in which:

FIG. 1 is a schematic plan view illustrating a display device according to an embodiment;

DETAILED DESCRIPTION OF THE EMBODIMENTS

Figure 2:
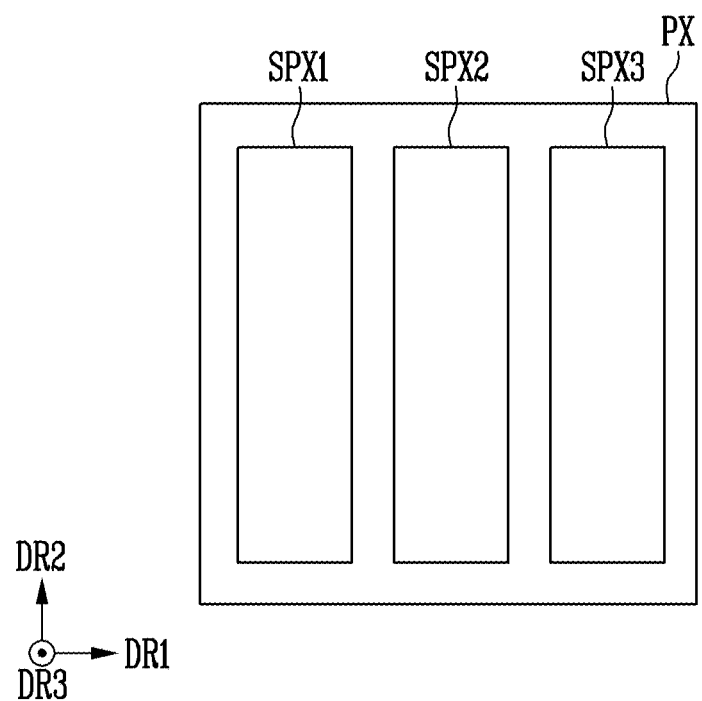
FIG. 2 is a diagram illustrating an example of a pixel of FIG. 1.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Similar reference numerals are used for similar components in describing each drawing. In the accompanying drawings, the dimensions of the structures are shown enlarged from the actual dimensions for the sake of clarity of the disclosure. Terms of "first," "second," and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. In the following description, the singular expressions include plural expressions unless the context clearly dictates otherwise.

It should be understood that in the application, a term of "include," "have," or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In case that a portion of a layer, a layer, an area, a plate, or the like is referred to as being "on" another portion, it includes not only a case where the portion is "directly on" another portion, but also a case where there is further another portion between the portion and another portion. In the specification, when a portion of a layer, a layer, an area, a plate, or the like is formed on another portion, a forming direction is not limited to an upper direction but includes forming the portion on a side surface or in a lower direction. On the contrary, when a portion of a layer, a layer, an area, a plate, or the like is formed "under" another portion, this includes not only a case where the portion is "directly beneath" another portion but also a case where there is further another portion between the portion and another portion.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, specific embodiments are described with reference to the accompanying drawings.

Figure 3:
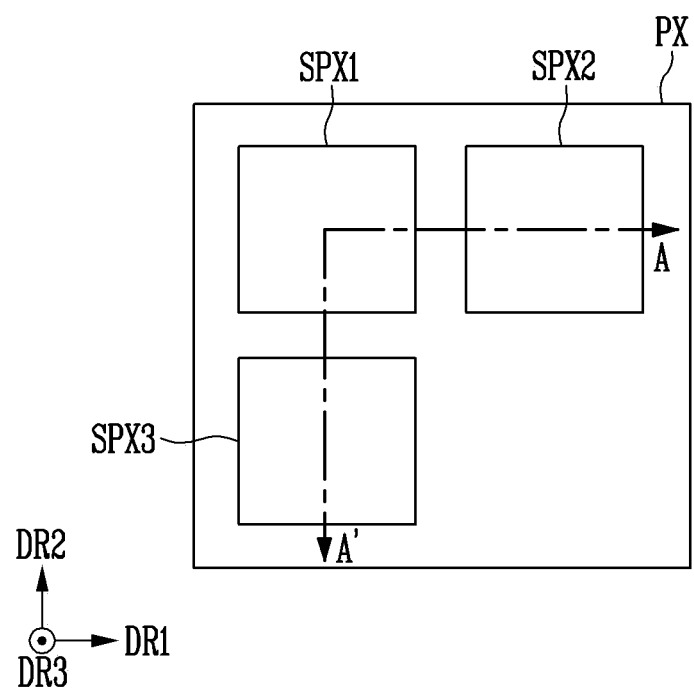
FIG. 3 is a diagram illustrating another example of the pixel of FIG. 1.

FIG. 1 is a schematic plan view illustrating a display device according to an embodiment. FIG. 2 is a schematic diagram illustrating an example of a pixel of FIG. 1. FIG. 3 is a schematic diagram illustrating an example of the pixel of FIG. 1.

Referring to FIG. 1, the display device 10 is a device for displaying a video or a still image. The display device 10 may be used as a display screen of various products such as not only a portable electronic device such as a mobile phone, a smart phone, a tablet personal computer (PC), a smart watch, a watch phone, a mobile communication terminal, an electronic notebook, an electronic book, a portable multimedia player (PMP), a navigation device, and an ultra-mobile PC (UMPC), but also a television, a notebook computer, a monitor, a billboard, and Internet of things (IOT).

The display device 10 may be formed in a rectangular shape in a plan view having a long side of a first direction DR1 and a short side of a second direction DR2 intersecting the first direction DR1. A corner where the long side of the first direction DR1 and the short side of the second direction DR2 meet may be formed to be rounded to have a selected curvature or may be formed in a right angle. The shape of the display device 10 in a plan view is not limited to a quadrangle, and may be formed in a different polygon, a circle, or an ellipse. The display device 10 may be formed to be flat, but is not limited thereto. For example, the display device 10 may include a curved portion formed at left and right ends and having a constant curvature or a varying curvature. The display device 10 may be flexibly formed to be crooked, curved, bent, folded, or rolled.

The display device 10 may further include pixels PX, scan lines extending in the first direction DR1, and data lines extending in the second direction DR2 to display an image. The pixels PX may be arranged in a matrix shape in the first direction DR1 and the second direction DR2.

Each of the pixels PX may include sub-pixels SPX1, SPX2, and SPX3 as shown in FIGS. 2 and 3. FIGS. 2 and 3 illustrate that each of the pixels PX may include a first sub-pixel SPX1, a second sub-pixel SPX2, and a third sub-pixel SPX3, but the embodiments of the specification are not limited thereto.

The first sub-pixel SPX1, the second sub-pixel SPX2, and the third sub-pixel SPX3 may be connected to any one of the data lines and at least one scan line among the scan lines.

Each of the first sub-pixel SPX1, the second sub-pixel SPX2, and the third sub-pixel SPX3 may have the shape of a rectangle, a square, or a rhombus in a plan view. For example, each of the first sub-pixel SPX1, the second sub-pixel SPX2, and the third sub-pixel SPX3 may have a rectangular shape with a short side of the first direction DR1 and a long side of the second direction DR2 as shown in FIG. 2. In other examples, each of the first sub-pixel SPX1, the second sub-pixel SPX2, and the third sub-pixel SPX3 may have a square or a rhombus shape with sides of the same length in the first direction DR1 and the second direction DR2 as shown in FIG. 3.

As shown in FIG. 2, the first sub-pixel SPX1, the second sub-pixel SPX2, and the third sub-pixel SPX3 may be arranged in the first direction DR1. In other examples, one of the second sub-pixel SPX2 and the third sub-pixel SPX3 may be arranged in the first direction DR1 with respect to the first sub-pixel SPX1, and the remaining sub-pixel and the first sub-pixel SPX1 may be arranged in the second direction DR2. As shown in FIG. 3, the first sub-pixel SPX1 and the second sub-pixel SPX2 may be arranged in the first direction DR1, and the first sub-pixel SPX1 and the third sub-pixel SPX3 may be arranged in the second direction DR2.

In other examples, one of the first sub-pixel SPX1 and the third sub-pixel SPX3 may be arranged in the first direction with respect to the second sub-pixel SPX2, and the remaining sub-pixel and the second sub-pixel SPX2 may be arranged in the second direction DR2. In other examples, one of the first sub-pixel SPX1 and the second sub-pixel SPX2 may be arranged in the first direction DR1 with respect to and the third sub-pixel SPX3, and the remaining sub-pixel and the third sub-pixel SPX3 may be arranged in the second direction DR2.

The first sub-pixel SPX1 may emit first light, the second sub-pixel SPX2 may emit second light, and the third sub-pixel SPX3 may emit third light. The first light may be light of a red wavelength band, the second light may be light of a green wavelength band, and the third light may be light of a blue wavelength band. The red wavelength band may be of about 600 nm to about 750 nm, the green wavelength band may be of about 480 nm to about 560 nm, and the blue wavelength band may be of about 370 nm to about 460 nm, but an embodiment of the specification is not limited thereto.

Each of the first sub-pixel SPX1, the second sub-pixel SPX2, and the third sub-pixel SPX3 may include an inorganic light emitting element including an inorganic semiconductor as a light emitting element that emits light. For example, the inorganic light emitting element may be a micro light emitting diode (LED) of a flip chip type, but an embodiment of the specification is not limited thereto.

As shown in FIGS. 2 and 3, the area of the first sub-pixel SPX1, the area of the second sub-pixel SPX2, and the area of the third sub-pixel SPX3 may be substantially the same, but embodiments of the specification are not limited thereto. At least one of the first sub-pixel SPX1, the second sub-pixel SPX2, and the third sub-pixel SPX3 may have a different area than the other sub-pixels. In other examples, two of the first sub-pixel SPX1, the second sub-pixel SPX2, and the third sub-pixel SPX3 may have substantially the same area and the other sub-pixel may have a different area. In other examples, the area of the first sub-pixel SPX1, the area of the second sub-pixel SPX2, and the area of the third sub-pixel SPX3 may be different from each other.

Figure 4:
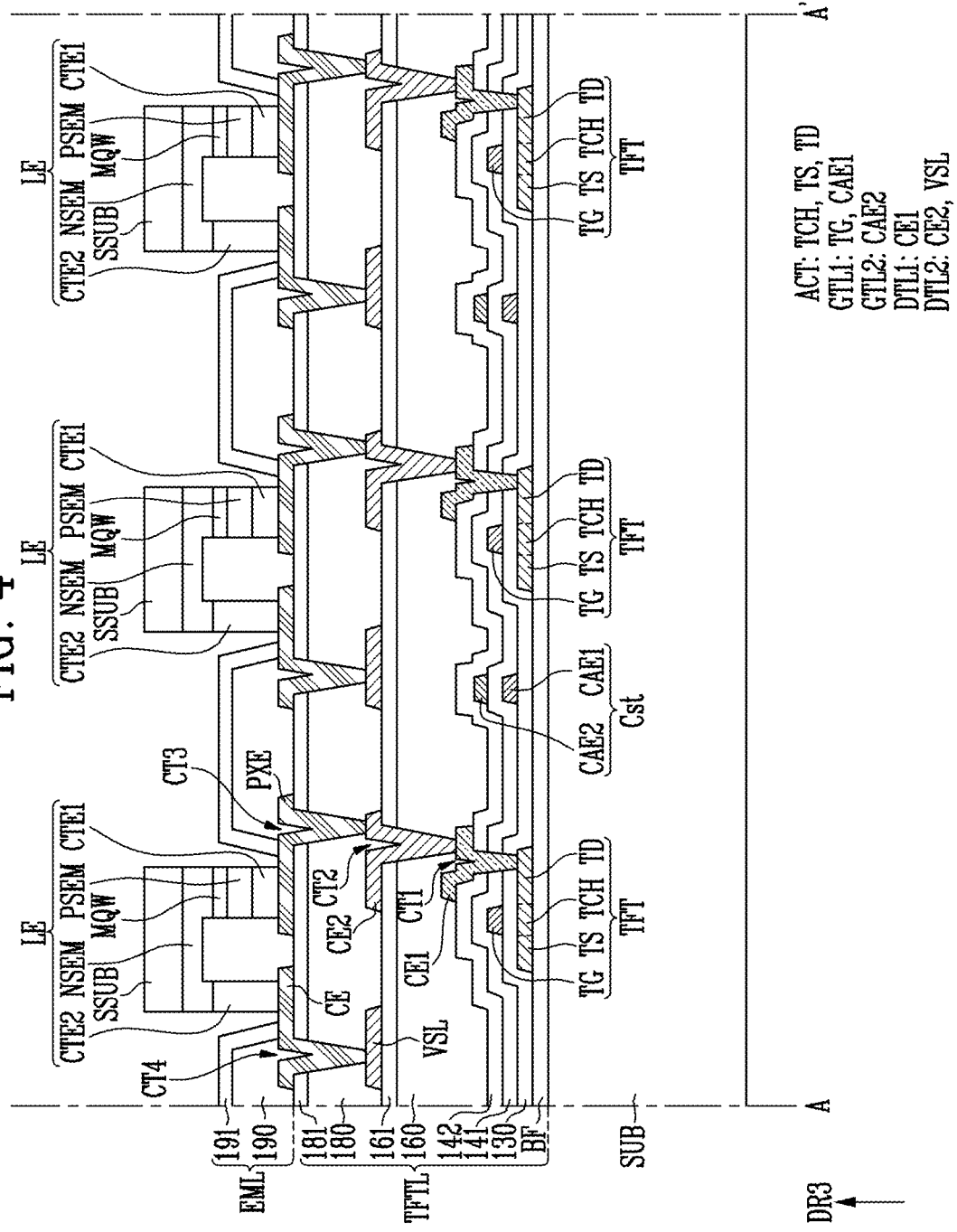
FIG. 4 is a schematic cross-sectional view illustrating an example of the display device taken along line A-A' of FIG. 3.

FIG. 4 is a schematic cross-sectional view illustrating an example of the display device taken along line A-A' of FIG. 3.

Referring to FIG. 4, a thin film transistor layer TFTL may be disposed on a substrate SUB. The thin film transistor layer TFTL may be a layer on which thin film transistors (TFTs) are formed.

The thin film transistor layer TFTL may include an active layer ACT, a first gate layer GTL1, a second gate layer GTL2, a first data metal layer DTL1, and a second data metal layer DTL2.

The display device 10 may include a buffer layer BF, a gate insulating layer 130, a first interlayer insulating layer 141, a second interlayer insulating layer 142, a first planarization layer 160, a first insulating layer 161, a second planarization layer 180, and a second insulating layer 181.

The substrate SUB may be a base substrate or a base member for supporting the display device 10. The substrate SUB may be a rigid substrate formed of glass. In other examples, the substrate SUB may be a flexible substrate capable of bending, folding, rolling, or the like. A flexible substrate SUB may include an insulating material such as a polymer resin such as polyimide (PI).

The buffer layer BF may be disposed on a surface of the substrate SUB. The buffer layer BF may prevent penetration of air or moisture. The buffer layer BF may be formed of inorganic layers alternately stacked. For example, the buffer layer BF may be formed of a multilayer in which one or more inorganic layers of a silicon nitride layer, a silicon oxynitride layer, a silicon oxide layer, a titanium oxide layer, and an aluminum oxide layer are alternately stacked. In other examples, the buffer layer BF may be omitted.

The active layer ACT may be disposed on the buffer layer BF. The active layer ACT may include a silicon semiconductor such as polycrystalline silicon, crystal single silicon, low-temperature polycrystalline silicon, and amorphous silicon, or may include an oxide semiconductor.

The active layer ACT may include a channel TCH, a first electrode TS, and a second electrode TD of the thin film transistor TFT. The channel TCH of the thin film transistor TFT may be an area overlapping a gate electrode TG of the thin film transistor TFT in a third direction DR3 that is a thickness direction of the substrate SUB. The first electrode TS of the thin film transistor TFT may be disposed on one side of the channel TCH, and the second electrode TD may be disposed on the other side of the channel TCH. The first electrode TS and the second electrode TD of the thin film transistor TFT may be areas which do not overlap the gate electrode TG in the third direction DR3. The first electrode TS and the second electrode TD of the thin film transistor TFT may be areas in which an ion is doped to a silicon semiconductor or an oxide semiconductor to have conductivity.

The gate insulating layer 130 may be disposed on the active layer ACT. The gate insulating layer 130 may be formed of an inorganic layer, for example, a silicon nitride layer, a silicon oxynitride layer, a silicon oxide layer, a titanium oxide layer, or an aluminum oxide layer.

The first gate layer GTL1 may be disposed on the gate insulating layer 130. The first gate layer GTL1 may include the gate electrode TG and of the thin film transistor TFT a first capacitor electrode CAE1. The first gate layer GTL1 may be formed as a single layer or multiple layers formed of any one of molybdenum (Mo), aluminum (Al), chromium (Cr), gold (Au), titanium (Ti), nickel (Ni), neodymium (Nd), and copper (Cu), or an alloy thereof.

The first interlayer insulating layer 141 may be disposed on the first gate layer GTL1. The first interlayer insulating layer 141 may be formed of an inorganic layer, for example, a silicon nitride layer, a silicon oxynitride layer, a silicon oxide layer, a titanium oxide layer, or an aluminum oxide layer.

The second gate layer GTL2 may be disposed on the first interlayer insulating layer 141. The second gate layer GTL2 may include a second capacitor electrode CAE2. The second gate layer GTL2 may be formed as a single layer or multiple layers formed of any one of molybdenum (Mo), aluminum (Al), chromium (Cr), gold (Au), titanium (Ti), nickel (Ni), neodymium (Nd), and copper (Cu), or an alloy thereof.

The second interlayer insulating layer 142 may be disposed on the second gate layer GTL2. The second interlayer insulating layer 142 may be formed of an inorganic layer, for example, a silicon nitride layer, a silicon oxynitride layer, a silicon oxide layer, a titanium oxide layer, or an aluminum oxide layer.

The first data metal layer DTL1 including a first connection electrode CE1 may be disposed on the second interlayer insulating layer 142. The first data metal layer DTL1 may be formed as a single layer or multiple layers formed of any one of molybdenum (Mo), aluminum (Al), chromium (Cr), gold (Au), titanium (Ti), nickel (Ni), neodymium (Nd), and copper (Cu), or an alloy thereof.

The first connection electrode CE1 may be electrically connected to the first electrode TS or the second electrode TD of the thin film transistor TFT through a first contact hole CT1 passing through the first interlayer insulating layer 141 and the second interlayer insulating layer 142.

On the first data metal layer DTL1, the first planarization layer 160 for flattening a step difference due to the active layer ACT, the first gate layer GTL1, the second gate layer GTL2, and the first data metal layer DTL1 may be formed. The first planarization layer 160 may be formed of an organic layer such as acryl resin, epoxy resin, phenolic resin, polyamide resin, or polyimide resin.

The first insulating layer 161 may be disposed on the first planarization layer 160. The first insulating layer 161 may be formed of an inorganic layer, for example, a silicon nitride layer, a silicon oxynitride layer, a silicon oxide layer, a titanium oxide layer, or an aluminum oxide layer.

The second data metal layer DTL2 may be formed on the first insulating layer 161. The second data metal layer DTL2 may include a second connection electrode CE2 and a first power line VSL. The second connection electrode CE2 may be electrically connected to the first connection electrode CE1 through a second contact hole CT2 passing through the first insulating layer 161 and the first planarization layer 160. The second data metal layer DTL2 may be formed as a single layer or multiple layers formed of any one of molybdenum (Mo), aluminum (Al), chromium (Cr), gold (Au), titanium (Ti), nickel (Ni), neodymium (Nd), and copper (Cu), or an alloy thereof.

The second planarization layer 180 for flattening a step difference may be formed on the second data metal layer DTL2. The second planarization layer 180 may be formed of an organic layer such as acryl resin, epoxy resin, phenolic resin, polyamide resin, or polyimide resin.

The second insulating layer 181 may be disposed on the second planarization layer 180. The second insulating layer 181 may be formed of an inorganic layer, for example, a silicon nitride layer, a silicon oxynitride layer, a silicon oxide layer, a titanium oxide layer, or an aluminum oxide layer.

An emission layer EML may be disposed on the second insulating layer 181. The emission layer EML may include pixel electrodes PXE, common electrodes CE, and light emitting elements LE. Each of the first sub-pixel SPX1, the second sub-pixel SPX2, and the third sub-pixel SPX3 may include the light emitting element LE electrically connected to the pixel electrode PXE and the common electrode CE. The pixel electrode PXE may be referred to as an anode electrode, and the common electrode CE may be referred to as a cathode electrode.

The pixel electrodes PXE and the common electrodes CE may be disposed on the second insulating layer 181. Each of the pixel electrodes PXE may be electrically connected to the second connection electrode CE2 through a third contact hole CT3 passing through the second insulating layer 181 and the second planarization layer 180. Accordingly, each of the pixel electrodes PXE may be electrically connected to the first electrode TS or the second electrode TD of the thin film transistor TFT through the first connection electrode CE1 and the second connection electrode CE2. Therefore, a pixel voltage or an anode voltage controlled by the thin film transistor TFT may be applied to the pixel electrode PXE.

Each of the common electrodes CE may be electrically connected to the first power line VSL through a fourth contact hole CT4 passing through the second insulating layer 181 and the second planarization layer 180. Accordingly, a first power voltage of the first power line VSL may be applied to each of the common electrodes CE.

The pixel electrodes PXE and the common electrodes CE may include a metal material having a high reflectance such as a stack structure of aluminum and titanium (Ti/Al/Ti), a stack structure of aluminum and ITO (ITO/Al/ITO), an APC alloy, and a stack structure of an APC alloy and ITO (ITO/APC/ITO). The APC alloy is an alloy of silver (Ag), palladium (Pd), and copper (Cu).

FIG. 4 illustrates that each of the light emitting elements LE is the micro LED of the flip-chip type in which the first contact electrode CTE1 and the second contact electrode CTE2 are disposed to face the pixel electrode PXE and the common electrode CE. The light emitting element LE may be formed of an inorganic material such as GaN. The length of the light emitting element LE in each the first direction DR1, the second direction DR2, and the third direction DR3 may be several μm to several hundred μm. For example, in the light emitting element LE, each of the length of the first direction DR1, the length of the second direction DR2, and the length of the third direction DR3 may be about 100 μm or less.

Each of the light emitting elements LE may be a light emitting structure including a base substrate SSUB, an n-type semiconductor NSEM, an active layer MQW, a p-type semiconductor PSEM, a first contact electrode CTE1, and a second contact electrode CTE2.

The base substrate SSUB may be a sapphire substrate, but the embodiments are not limited thereto.

The n-type semiconductor NSEM may be disposed on a surface of the base substrate SSUB. For example, the n-type semiconductor NSEM may be disposed on a lower surface of the base substrate SSUB. The n-type semiconductor NSEM may be formed of GaN doped with an n-type dopant such as Si, Ge, or Sn.

The active layer MQW may be disposed on a portion of a surface of the n-type semiconductor NSEM. The active layer MQW may include a material having a single or a multiple quantum well structure. In case that the active layer MQW has a multiple quantum well structure, the active layer MQW may have a structure in which well layers and barrier layers are alternately stacked. The well layers may be formed of InGaN, and the barrier layers may be formed of GaN or AlGaN, but are not limited thereto. In other examples, the active layer MQW may alternately stack semiconductor materials with a large band gap energy and semiconductor materials with a small band gap energy, and may also include group 3 to group 5 semiconductor materials depending upon the wavelength band of the emitted light.

The p-type semiconductor PSEM may be disposed on a surface of the active layer MQW. The p-type semiconductor PSEM may be formed of GaN doped with a p-type dopant such as Mg, Zn, Ca, Se, or Ba.

The first contact electrode CTE1 may be disposed on the p-type semiconductor PSEM, and the second contact electrode CTE2 may be disposed on a portion of a surface of the n-type semiconductor NSEM. The portion of the surface of the n-type semiconductor NSEM on which the second contact electrode CTE2 is disposed may be spaced apart from the portion of the n-type semiconductor NSEM on which the active layer MQW is disposed.

The first contact electrode CTE1 and the pixel electrode PXE may be adhered to each other through a conductive adhesive member such as an anisotropic conductive film (ACF) or an anisotropic conductive paste (ACP). In other examples, the first contact electrode CTE1 and the pixel electrode PXE may be adhered to each other through a soldering process.

A bank 190 covering an edge of the pixel electrode PXE and an edge of the common electrode CE may be disposed on the second insulating layer 181. The bank 190 may be formed an organic layer such as an acryl resin, an epoxy resin, phenolic resin, polyamide resin, or polyimide resin.

The third insulating layer 191 may be disposed on the bank 190. The third insulating layer 191 may cover the edge of the pixel electrode PXE and the edge of the common electrode CE. The third insulating layer 191 may be formed of an inorganic layer, for example, a silicon nitride layer, a silicon oxynitride layer, a silicon oxide layer, a titanium oxide layer, or an aluminum oxide layer.

Figure 5:
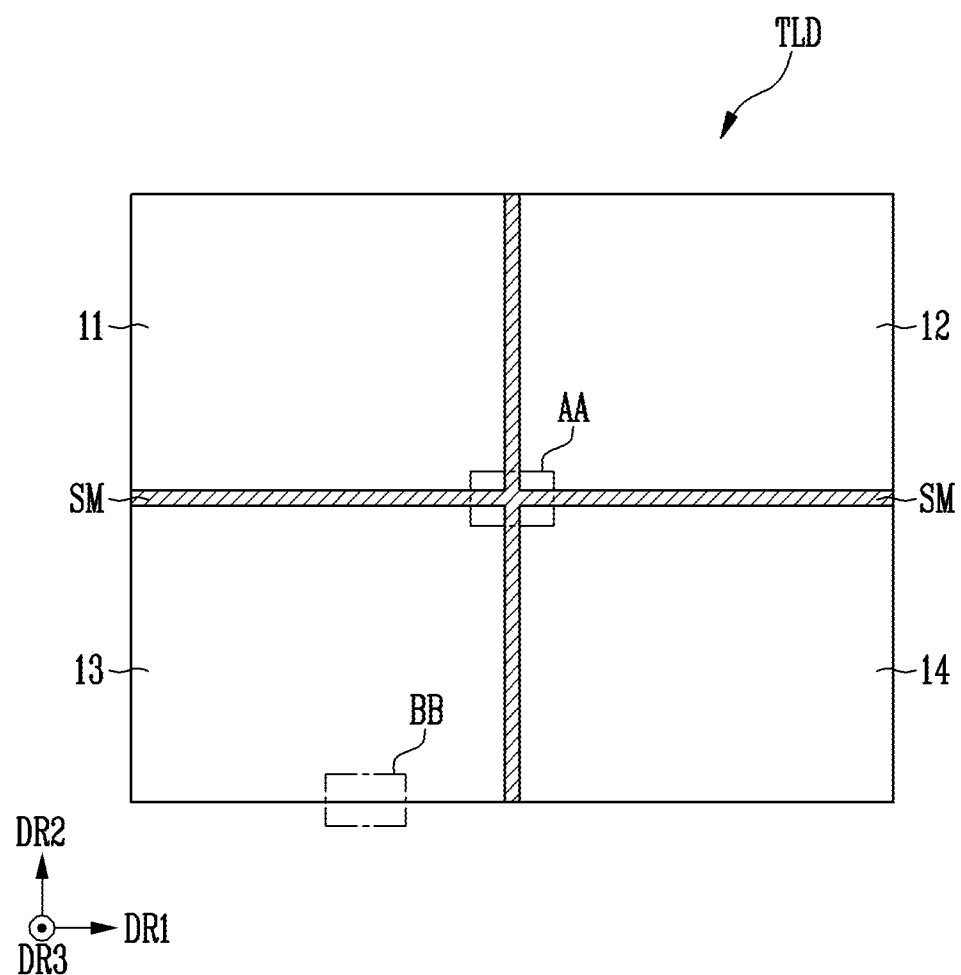
FIG. 5 is a schematic perspective view illustrating a tiled display device including multiple display devices according to an embodiment.

FIG. 5 is a perspective view illustrating a tiled display device including multiple display devices according to an embodiment.

Referring to FIG. 5, the tiled display device TLD may include multiple display devices 11, 12, 13, and 14, and a seam SM. For example, the tiled display device TLD may include a first display device 11, a second display device 12, a third display device 13, and a fourth display device 14.

The display devices 11, 12, 13, and 14 may be arranged in a grid shape. The display devices 11, 12, 13, and 14 may be arranged in a matrix form in M (M is a positive integer) number of rows and N (N is a positive integer) number of columns. For example, the first display device 11 and the second display device 12 may be adjacent to each other in the first direction DR1. The first display device 11 and the third display device 13 may be adjacent to each other in the second direction DR2. The third display device 13 and the fourth display device 14 may be adjacent to each other in the first direction DR1. The second display device 12 and the fourth display device 14 may be adjacent to each other in the second direction DR2.

However, the number and disposition of the display devices 11, 12, 13, and 14 in the tiled display device TLD are not limited to those shown in FIG. 5. The number and disposition of the display devices 11, 12, 13, and 14 in the tiled display device TLD may be determined according to a size of each of the display device 10 and the tiled display device TLD and a shape of the tiled display device TLD.

Each of the display devices 11, 12, 13, and 14 may have the same size, but is not limited thereto. For example, each of the display devices 11, 12, 13, and 14 may have different sizes.

Each of the display devices 11, 12, 13, and 14 may have a rectangular shape including a long side and a short side. The display devices 11, 12, 13, and 14 may be disposed in a state in which the long sides or the short sides are connected to each other. Some or all of the display devices 11, 12, 13, and 14 may be disposed at an edge of the tiled display device TLD and may form one side of the tiled display device TLD. At least one display device among the display devices 11, 12, 13, and 14 may be disposed at a corner of the tiled display device TLD, and may form two adjacent sides of the tiled display device TLD. At least one display device among the display devices 11, 12, 13, and 14 may be surrounded by other display devices.

Each of the display devices 11, 12, 13, and 14 may be substantially the same as the display device 10 described with reference to FIGS. 1 to 4. Therefore, a description of each of the display devices 11, 12, 13, and 14 is omitted.

The seam SM may include a coupling member or an adhesive member. The display devices 11, 12, 13, and 14 may be connected to each other through the coupling member or the adhesive member of the seam SM. The seam SM may be disposed between the first display device 11 and the second display device 12, between the first display device 11 and the third display device 13, between the second display device 12 and the fourth display device 14, and between the third display device 13 and the fourth display device 14.

Figure 6:
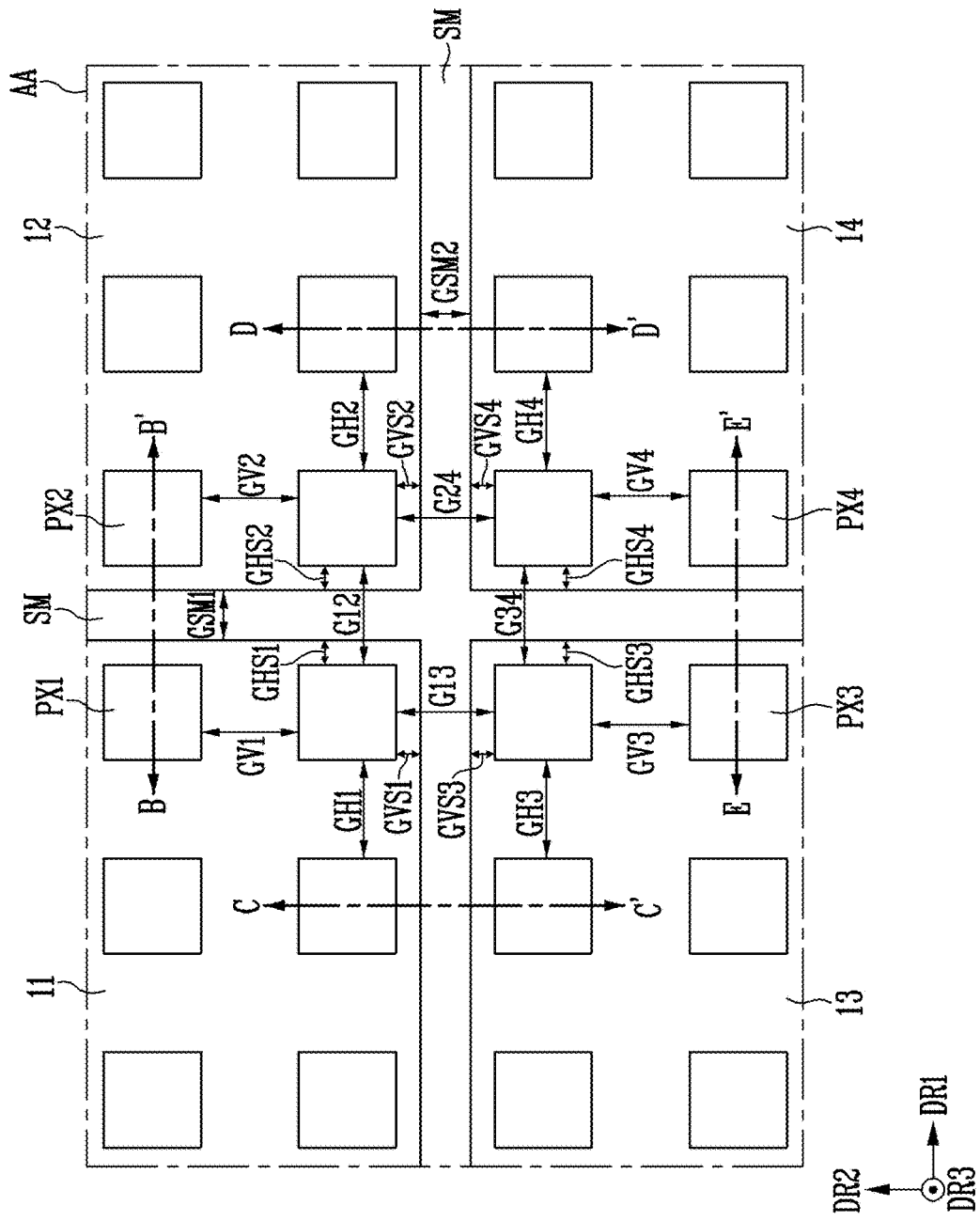
FIG. 6 is an enlarged schematic layout diagram illustrating an area AA of FIG. 5 in detail.

FIG. 6 is an enlarged layout diagram illustrating an area AA of FIG. 5 in detail.

Referring to FIG. 6, the seam SM may have a crisscross, a cross, or a plus sign shape, in a plan view, in the center area of the tiled display device TLD in which the first display device 11, the second display device 12, the third display device 13, and the fourth display device 14 are adjacent to each other. The seam SM may be disposed between the first display device 11 and the second display device 12, between the first display device 11 and the third display device 13, between the second display device 12 and the fourth display device 14, and between the third display device 13 and the fourth display device 14.

The first display device 11 may include first pixels PX1 arranged in a matrix form in the first direction DR1 and the second direction DR2 to display an image. The second display device 12 may include second pixels PX2 arranged in a matrix form in the first direction DR1 and the second direction DR2 to display an image. The third display device 13 may include third pixels PX3 arranged in a matrix form in the first direction DR1 and the second direction DR2 to display an image. The fourth display device 14 may include fourth pixels PX4 arranged in a matrix form in the first direction DR1 and the second direction DR2 to display an image.

A minimum distance between the first pixels PX1 adjacent in the first direction DR1 may be defined as a first horizontal separation distance GH1, and a minimum distance between the second pixels PX2 adjacent in the first direction DR1 may be defined as a second horizontal separation distance GH2. The first horizontal separation distance GH1 and the second horizontal separation distance GH2 may be substantially the same.

The seam SM may be disposed between the first pixel PX1 and the second pixel PX2 adjacent in the first direction DR1. A minimum distance G12 between the first pixel PX1 and the second pixel PX2 adjacent in the first direction DR1 may be a sum of a minimum distance GHS1 between the first pixel PX1 and the seam SM in the first direction DR1, a minimum distance GHS2 between the second pixel PX2 and the seam SM in the first direction DR1, and a width GSM1 of the seam SM in the first direction DR1.

The minimum distance G12 between the first pixel PX1 and the second pixel PX2 adjacent in the first direction DR1, the first horizontal separation distance GH1, and the second horizontal separation distance GH2 may be substantially the same. To this end, the minimum distance GHS1 between the first pixel PX1 and the seam SM in the first direction DR1 may be less than the first horizontal separation distance GH1, and the minimum distance GHS2 between the second pixel PX2 and the seam SM in the first direction DR1 may be less than the second horizontal separation distance GH2. The width GSM1 of the seam SM in the first direction DR1 may be less than the first horizontal separation distance GH1 or the second horizontal separation distance GH2.

A minimum distance between the third pixels PX3 adjacent in the first direction DR1 may be defined as a third horizontal separation distance GH3, and a minimum distance between the fourth pixels PX4 adjacent in the first direction DR1 may be defined as a fourth horizontal separation distance GH4. The third horizontal separation distance GH3 and the fourth horizontal separation distance GH4 may be substantially the same.

The seam SM may be disposed between the third pixel PX3 and the fourth pixel PX4 adjacent in the first direction DR1. A minimum distance G34 between the third pixel PX3 and the fourth pixel PX4 adjacent in the first direction DR1 may be a sum of a minimum distance GHS3 between the third pixel PX3 and the seam SM in the first direction DR1, a minimum distance GHS4 between the fourth pixel PX4 and the seam SM in the first direction DR1, and the width GSM1 of the seam SM in the first direction DR1.

The minimum distance G34 between the third pixel PX3 and the fourth pixel PX4 adjacent in the first direction DR1, the third horizontal separation distance GH3, and the fourth horizontal separation distance GH4 may be substantially the same. To this end, the minimum distance GHS3 between the third pixel PX3 and the seam SM in the first direction DR1 may be less than the third horizontal separation distance GH3 and the minimum distance GHS4 between the fourth pixel PX4 and the seam SM in the first direction DR1 may be less than the fourth horizontal separation distance GH4. The width GSM1 of the seam SM in the first direction DR1 may be less than the third horizontal separation distance GH3 or the fourth horizontal separation distance GH4.

A minimum distance between the first pixels PX1 adjacent in the second direction DR2 may be defined as a first vertical separation distance GV1, and a minimum distance between the third pixels PX3 in the second direction DR2 may be defined as a third vertical separation distance GV3. The first vertical separation distance GV1 and the third vertical separation distance GV3 may be substantially the same.

The seam SM may be disposed between the first pixel PX1 and the third pixel PX3 adjacent in the second direction DR2. A minimum distance G13 between the first pixel PX1 and the third pixel PX3 adjacent in the second direction DR2 may be a sum of a minimum distance GVS1 between the first pixel PX1 and the seam SM in the second direction DR2, a minimum distance GVS3 between the third pixel PX3 and the seam SM in the second direction DR2, and a width GSM2 of the seam SM in the second direction DR2.

The minimum distance G13 between the first pixel PX1 and the third pixel PX3 adjacent in the second direction DR2, the first vertical separation distance GV1, and the third vertical separation distance GV3 may be substantially the same. To this end, the minimum distance GVS1 between the first pixel PX1 and the seam SM in the second direction DR2 may be less than the first vertical separation distance GV1, and the minimum distance GVS3 between the third pixel PX3 and the seam SM in the second direction DR2 may be less than the third vertical separation distance GV3. The width GSM2 in the second direction DR2 may be less than the first vertical separation distance GV1 or the third vertical separation distance GV3.

A minimum distance between the second pixels PX2 adjacent in the second direction DR2 may be defined as a second vertical separation distance GV2, and a minimum distance between the fourth pixels PX4 adjacent in the second direction DR2 may be defined as a fourth vertical separation distance GV4. The second vertical separation distance GV2 and the fourth vertical separation distance GV4 may be substantially the same.

The seam SM may be disposed between the second pixel PX2 and the fourth pixel PX4 adjacent in the second direction DR2. A minimum distance G24 between the second pixel PX2 and the fourth pixel PX4 adjacent in the second direction DR2 may be a sum of a minimum distance GVS2 between the second pixel PX2 and the seam SM in the second direction DR2, a minimum distance GVS4 between the fourth pixel PX4 and the seam SM in the second direction DR2, and the distance GSM2 of the seam SM in the second direction DR2.

The minimum distance G24 between the second pixel PX2 and the fourth pixel PX4 adjacent in the second direction DR2, the second vertical separation distance GV2, and the fourth vertical separation distance GV4 may be substantially the same. To this end, the minimum distance GVS2 between the second pixel PX2 and the seam SM in the second direction DR2 may be less than the second vertical separation distance GV2, and the minimum distance GVS4 between the fourth pixel PX4 and the seam SM in the second direction DR2 may be less than the fourth vertical separation distance GV4. The width GSM2 of the seam SM in the second direction DR2 may be less than the second vertical separation distance GV2 or the fourth vertical separation distance GV4.

As shown in FIG. 6, the minimum distance between the pixels of the display devices adjacent to each other may be substantially the same as the minimum distance between the pixels of each of the display devices so that the seam SM is not visually recognized between images displayed by the display devices 11, 12, 13, and 14.

Figure 7:
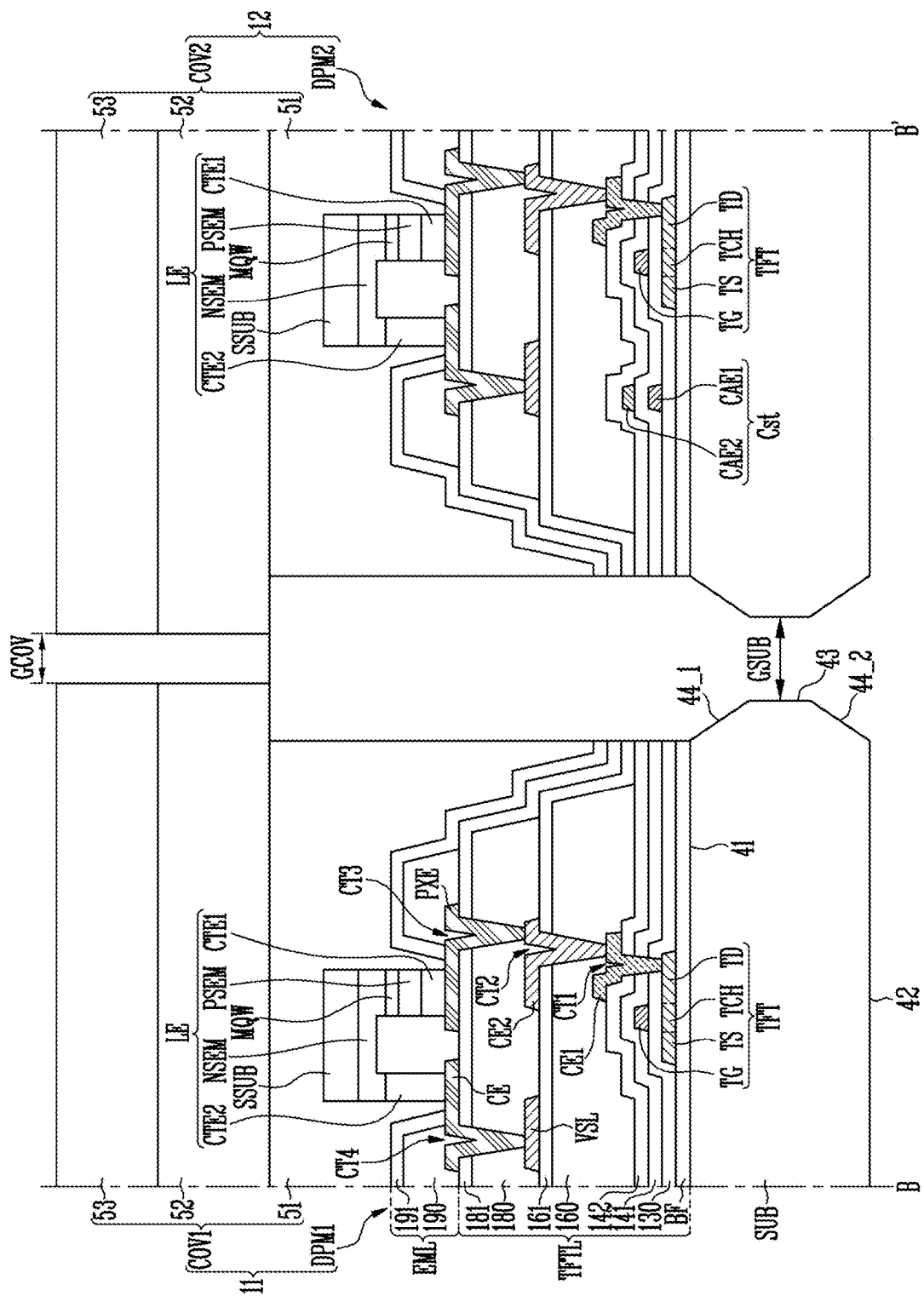
FIG. 7 is a schematic cross-sectional view illustrating an example of the tiled display device taken along line B-B' of FIG. 6.

FIG. 7 is a cross-sectional view illustrating an example of the tiled display device taken along line B-B' of FIG. 6.

Referring to FIG. 7, the first display device 11 may include a first display module DPM1 and a first front cover COV1. The second display device 12 may include a second display module DPM2 and a second front cover COV2.

Each of the first display module DPM1 and the second display module DPM2 may include the substrate SUB, the thin film transistor layer TFTL, and the emission layer EML. The thin film transistor layer TFTL and the emission layer EML are already described in detail with reference to FIG. 4, and repetitive descriptions with respect to of FIG. 4 may be omitted.

The substrate SUB may include a first surface 41 on which the thin film transistor layer TFTL is disposed, a second surface 42 facing the first surface, and a first side surface 43 disposed between the first surface 41 and the second surface 42. The first surface 41 may be a front surface or an upper surface of the substrate SUB, and the second surface 42 may be a rear surface or a lower surface of the substrate SUB.

The substrate SUB may further include a first chamfer surface 44_1 disposed between the first surface 41 and the first side surface 43 and a second chamfer surface 44_2 disposed between the second surface 42 and the first side surface 43. The thin film transistor layer TFTL and the emission layer EML may not be disposed on the chamfer surfaces 44_1 and 44_2. The substrate SUB of the first display device 11 and the substrate of the second display device 12 may be prevented from colliding with each other and being damaged, by the chamfer surfaces 44_1 and 44_2.

The first chamfer surface 44_1 may also be disposed between the first surface 41 and each of the other side surfaces as well as the first side surface 43 and the second chamfer surface 44_2 may also be disposed between the second surface 42 and each of other side surfaces as well as the first side surface 43. For example, when the first display device 11 and the second display device 12 have the rectangular shape, in a plan view, as shown in FIG. 5, the chamfer surfaces 44_1 and 44_2 of the substrate SUB may be disposed between the first surface 41 and each of a second side surface, a third side surface, and a fourth side surface, and between the second surface 42 and each of the second side surface, the third side surface, and the fourth side surface.

The first front cover COV1 may be disposed on a chamfer surface 44 of the substrate SUB. The first front cover COV1 may protrude more than the substrate SUB in the first direction DR1 and the second direction DR2. Therefore, a distance GSUB between the substrate SUB of the first display device 11 and the substrate SUB of the second display device 12 may be greater than a distance GCOV between the first front cover COV1 and the second front cover COV2.

Each of the first front cover COV1 and the second front cover COV2 may include an adhesive member 51, a light transmittance control layer 52 disposed on the adhesive member 51, and an anti-glare layer 53 disposed on the light transmittance control layer 52.

The adhesive member 51 of the first front cover COV1 serves to attach the emission layer EML and the first front cover COV1 of the first display module DPM1. The adhesive member 51 of the second front cover COV2 serves to attach the emission layer EML and the second front cover COV2 of the second display module DPM2. The adhesive member 51 may be a transparent adhesive member capable of transmitting light. For example, the adhesive member 51 may be an optically clear adhesive film or an optically clear resin.

The anti-glare layer 53 may be designed to diffusely reflect external light to prevent degradation of visual recognition of an image due to reflection of the external light as it is. Accordingly, a contrast ratio of the image displayed by the first display device 11 and the second display device 20 may be increased by the anti-glare layer 53.

The light transmittance control layer 52 may be designed to reduce a transmittance of external light or light reflected from the first display module DPM1 and the second display module DPM2. Accordingly, a distance GSUB between the substrate SUB of the first display module DPM1 and the substrate SUB of the second display module DPM2 may be prevented from being visually recognized from the outside.

The anti-glare layer 53 may be implemented with a polarizing plate, and the light transmittance control layer 52 may be implemented with a phase delay layer, but an embodiment of the specification is not limited thereto.

Examples of the tiled display device taken along lines C-C', D-D', and E-E' of FIG. 6 is substantially the same as that of the tiled display device taken along line B-B' described with refer to FIG. 7. Repetitive descriptions are omitted.

Figure 8:
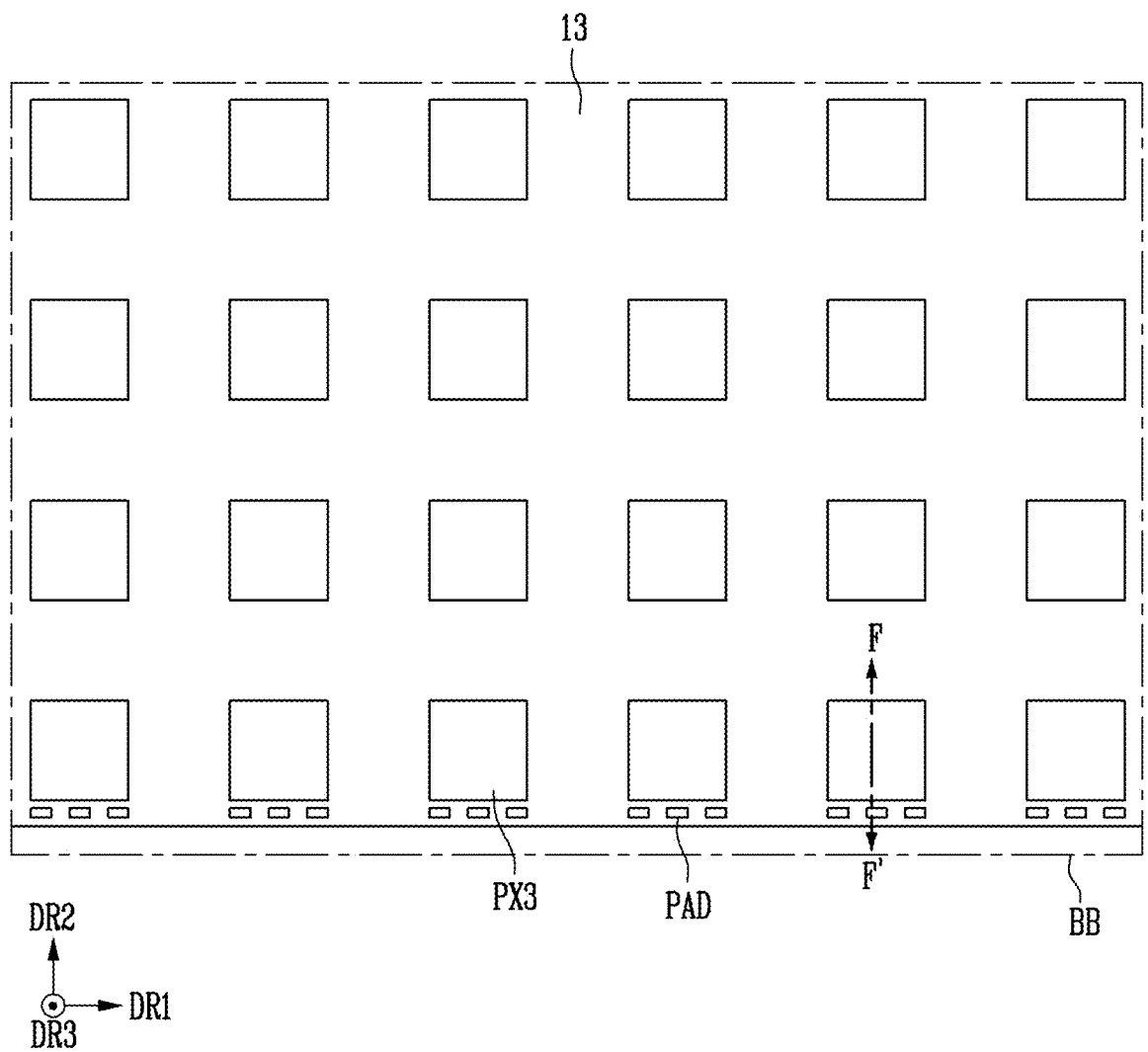
FIG. 8 is an enlarged schematic layout diagram illustrating an area BB of FIG. 5 in detail.

FIG. 8 is an enlarged layout diagram illustrating an area BB of FIG. 5 in detail. In FIG. 8, for convenience of description, pads PAD disposed under the third display device 13 and the third pixel PX3 are shown. Since the first display device 11, the second display device 12, and the fourth display device 14 have substantially the same configuration as the third display device 13, repetitive descriptions are omitted.

Referring to FIG. 8, the pads PAD may be disposed on a lower edge of the third display device 13. In case that data lines DL of FIG. 9 of the third display device 13 extend in the second direction DR2, the pads PAD may be disposed on an upper side edge and a lower side edge of the third display device 13. In other examples, in case that the data lines DL of FIG. 9 of the third display device 13 extend in the first direction DR1, the pads PAD may be disposed at a left edge and a right edge of the third display device 13.

Each of the pads PAD may be electrically connected to the data line on the upper surface of the substrate SUB. Each of the pads PAD may be electrically connected to a side surface line SSL. The side surface line SSL may be disposed on the upper surface, one side surface, and the lower surface (or the rear surface) of the substrate SUB. The side surface line SSL may be electrically connected to a connection line CCL of FIG. 9 on the lower surface of the substrate SUB.

Figure 9:
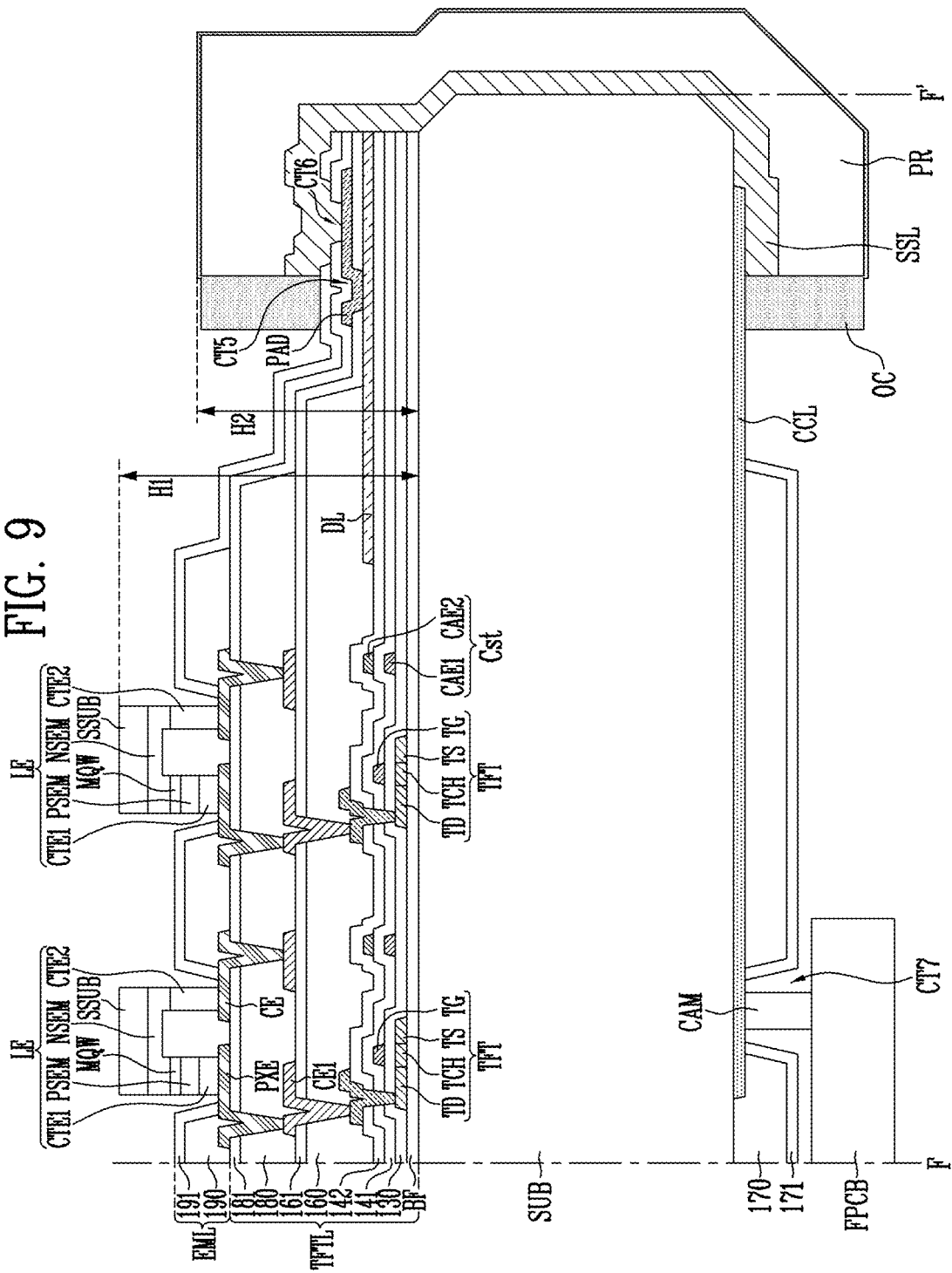
FIG. 9 is a schematic cross-sectional view illustrating an example of the tiled display device taken along line F-F' of FIG. 8.

FIG. 9 is a schematic cross-sectional view illustrating an example of the tiled display device taken along line F-F' of FIG. 8. In FIG. 9, the same reference numerals are assigned to the same components as those of the schematic cross-sectional view shown in FIG. 4, and a description overlapping the description of FIG. 4 is omitted.

Referring to FIG. 9, the pad PAD may be disposed on the first insulating layer 161. A portion of the pad PAD may not be covered by the second insulating layer 181 and the third insulating layer 191 and may be exposed. The pad PAD, the pixel electrodes PXE, and the common electrodes CE may include the same material. For example, the pad PAD may include a metal material having a high reflectance such as a stack structure of aluminum and titanium (Ti/Al/Ti), a stack structure of aluminum and ITO (ITO/Al/ITO), an APC alloy, and a stack structure of an APC alloy and ITO (ITO/APC/ITO).

The first data metal layer DTL1 of FIG. 4 may include a data line DL. The data line DL may be disposed on the second interlayer insulating layer 142. The data line DL and the first connection electrode CE1 may be disposed on the same layer and may include the same material.

The pad PAD may be electrically connected to the data line DL through a fifth contact hole CT5 passing through the first planarization layer 160, the first insulating layer 161, the second planarization layer 180, and the second insulating layer 181.

The connection line CCL may be disposed on the lower surface of the substrate SUB. The connection line CCL may be a single layer or multiple layers formed of any one of molybdenum (Mo), aluminum (Al), chromium (Cr), gold (Au), titanium (Ti), nickel (Ni), neodymium (Nd), and copper (Cu), or an alloy thereof.

The third planarization layer 170 may be disposed on a portion of the connection line CCL. The third planarization layer 170 may be formed of an organic layer such as acryl resin, epoxy resin, phenolic resin, or polyamide resin, polyimide resin.

The fourth insulating layer 171 may be disposed on the third planarization layer 170. The fourth insulating layer 171 may be formed of an inorganic layer, for example, a silicon nitride layer, a silicon oxynitride layer, a silicon oxide layer, a titanium oxide layer, or an aluminum oxide layer.

The side surface line SSL may be disposed on an upper surface edge, the side surface, and a lower surface edge of the substrate SUB. An end of the side surface line SSL may be electrically connected to the pad PAD through a sixth contact hole CT6 passing through the third insulating layer 191. Another end of the side surface line SSL may be electrically connected to the connection line CCL.

The side surface line SSL may be disposed on the side surface of the substrate SUB, a side surface of the buffer layer BF, a side surface of the gate insulating layer 130, a side surface of the first interlayer insulating layer 141, a side surface of the second interlayer insulating layer 142, a side surface of the first insulating layer 161, and a side surface of the second insulating layer 181.

Since the pad PAD formed on an upper surface edge of the substrate SUB and the connection line CCL formed on a lower surface edge of the substrate SUB are electrically connected through the side surface line SSL, in order to protect the side surface line SSL exposed to the outside from moisture and oxygen and prevent the side surface line SSL from being visually recognized by a user in appearance, a first coating pattern PR and a second coating pattern OC surrounding an edge area EDG (refer to FIG. 11) may be formed.

According to an embodiment, the first coating pattern PR and the second coating pattern OC may include a photoresist and a black pigment. For example, the photoresist may include a binder including a photosensitive polymer. A light blocking material may include a black pigment for expressing black. The black pigment may include carbon black, titanium black, or the like. The first coating pattern PR and the second coating pattern OC may further include a dispersing agent for evenly dispersing the black pigment in the photoresist.

Figure 18:
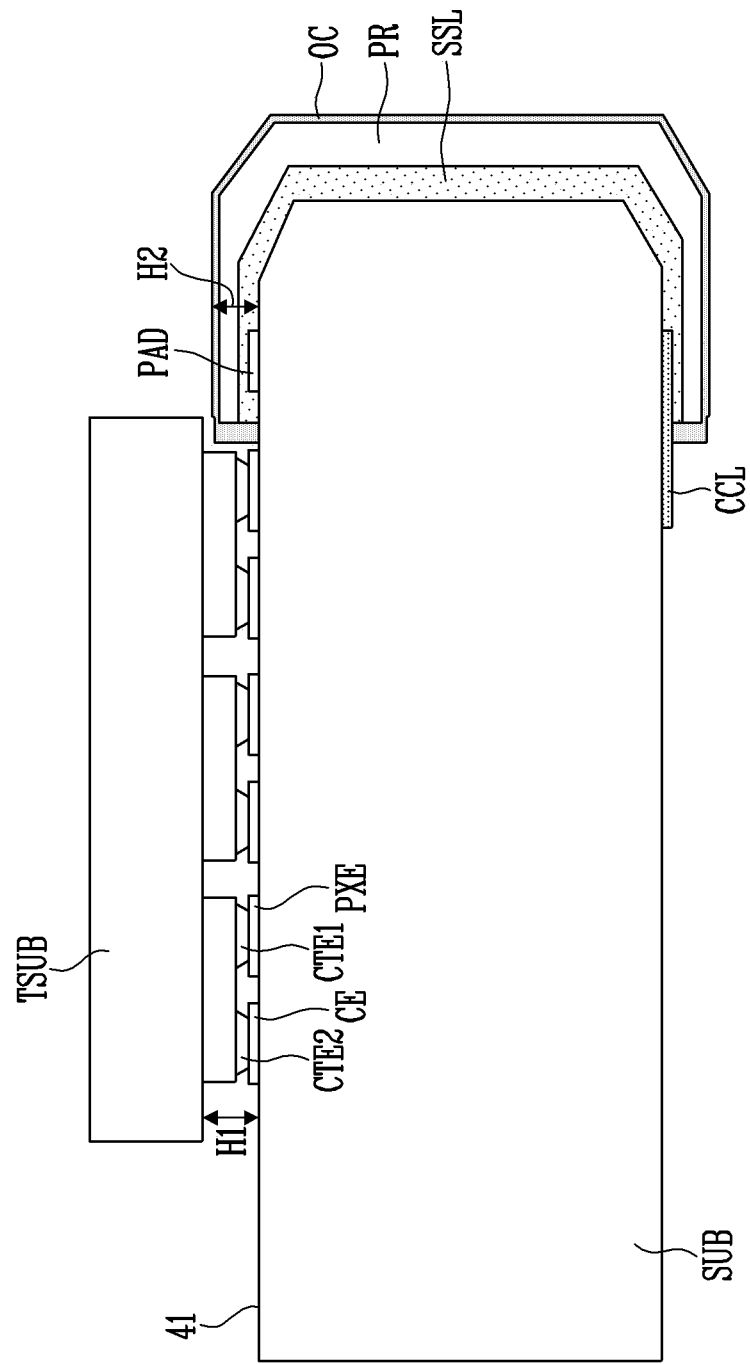
FIGS. 18 to 19B are schematic diagrams illustrating an effect of the disclosure.

The light emitting elements LE disposed in the emission layer EML may be transferred on the pixel electrode PXE and the common electrode CE of the substrate SUB through an electrostatic method using an electrostatic head or a stamp method using a polymer material having elasticity such as polydimethylsiloxane (PDMS) or silicone as a transfer substrate (refer to TSUB of FIG. 18). In case that a height from a surface of the substrate SUB to an upper surface of the second coating pattern OC is higher than a height from a surface of the substrate SUB to an upper surface of the light emitting element LE, contact failure between the first contact electrode CTE1 of the light emitting element LE and the pixel electrode PXE and/or contact failure between the second contact electrode CTE2 and the common electrode CE may occur.

In order to reduce a thickness of the first coating pattern PR and the second coating pattern OC surrounding the side surface lines SSL, the second coating pattern OC and the first coating pattern PR may not overlap each other in a thickness direction. A first height H1 from a surface of the substrate SUB to the upper surface of the light emitting element LE may be formed to be higher than a second height H2 from a surface of the substrate SUB to the upper surface of the second coating pattern OC. Hereinafter, the first coating pattern PR and the second coating pattern OC are described in more detail with reference to FIGS. 11 to 19B.

A flexible film FPCB may be disposed on a lower surface of the fourth insulating layer 171. The flexible film FPCB may be connected to the connection line CCL through a seventh contact hole CT7 passing through the third planarization layer 170 and the third insulating layer 171 using a conductive adhesive member CAM. A source driving circuit for supplying data voltages to the data lines DL may be disposed on a lower surface of the flexible film FPCB. The conductive adhesive member CAM may be an anisotropic conductive film or an anisotropic conductive paste.

As shown in FIGS. 8 and 9, in the third display device 13, the source driving circuit of the flexible film FPCB disposed under the substrate SUB may be electrically connected to the data line DL through the connection line CCL, the side surface line SSL, and the pad PAD. Since the source driving circuit SIC is disposed on the substrate SUB, a non-display area NDA may be eliminated, and thus the pixels PX may be formed at the edge of the substrate SUB.

Figure 10:
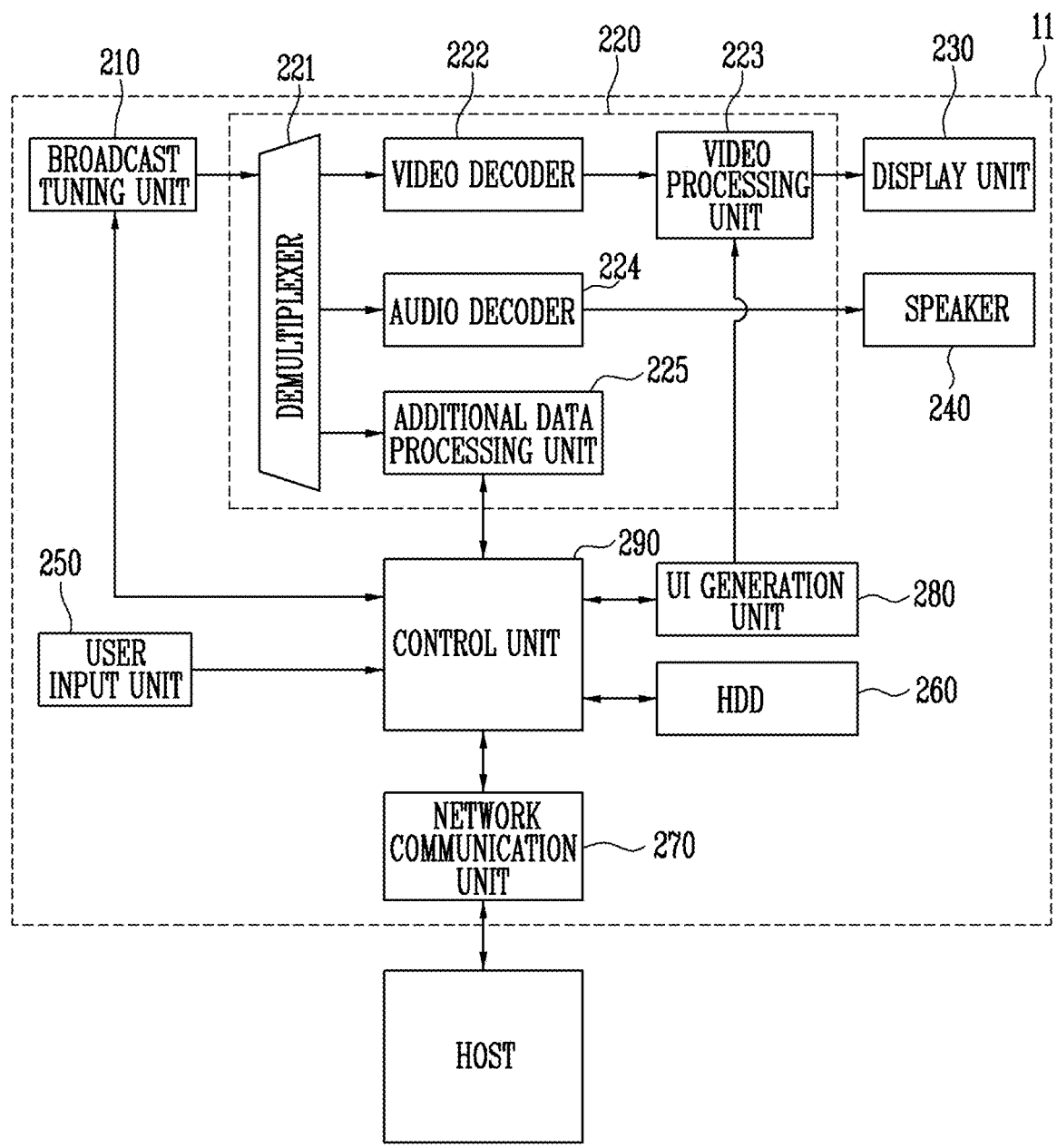
FIG. 10 is a block diagram illustrating a tiled display device according to an embodiment.

FIG. 10 is a block diagram illustrating a tiled display device according to an embodiment.

In FIG. 10, the first display device 11 and a host system HOST are shown for convenience of description.

Referring to FIG. 10, the tiled display device TLD according to an embodiment may include the host system HOST, a broadcast tuning unit 210, a signal processing unit 220, a display unit 230, a speaker 240, a user input unit 250, an HDD 260, a network communication unit 270, a UI generation unit 280, and a control unit 290.

The host system HOST may be implemented as a television system, a home theater system, a set-top box, a navigation system, a DVD player, a Blu-ray player, a personal computer (PC), a mobile phone system, or a tablet.

A user's instruction may be input to the host system HOST in various formats. For example, an instruction by a user's touch may be input to the host system HOST. In other examples, a user's instruction may be input to the host system HOST through a keyboard or a button input of a remote controller.

The host system HOST may receive original video data corresponding to an original image from the outside. The host system HOST may divide the original video data by the number of display devices. For example, the host system HOST may divide the original video data into first video data corresponding to a first image, second video data corresponding to a second image, third video data corresponding to a third image, and fourth video data corresponding to a fourth image, in response to the first display device 11, the second display device 12, the third display device 13, and the fourth display device 14. The host system HOST may transmit the first video data to the first display device 11, transmit the second video data to the second display device 12, transmit the third video data to the third display device 13, and transmit the fourth video data to the fourth display device 14.

The first display device 11 may display the first image according to the first video data, the second display device 12 may display the second image according to the second video data, the third display device 13 may display the third image according to the third video data, and the fourth display device 14 may display the fourth image according to the fourth video data. Accordingly, the user may view the original image in which the first to fourth images displayed on the first to fourth display devices 11, 12, 13 and 14 are combined.

The first display device 11 may include the broadcast tuning unit 210, the signal processing unit 220, the display unit 230, the speaker 240, the user input unit 250, the HDD 260, the network communication unit 270, the UI generation unit 280, and the control unit 290.

The broadcast tuning unit 210 may tune a selected channel frequency under control of the control unit 290 and receive a broadcast signal of a corresponding channel through an antenna. The broadcast tuning unit 210 may include a channel detection module and an RF demodulation module.

A broadcast signal demodulated by the broadcast tuning unit 210 may be processed by the signal processing unit 220 and output to the display unit 230 and the speaker 240. Here, the signal processing unit 220 may include a demultiplexer 221, a video decoder 222, a video processing unit 223, an audio decoder 224, and an additional data processing unit 225.

The demultiplexer 221 may divide the demodulated broadcast signal into a video signal, an audio signal, and additional data. The divided video signal, audio signal, and additional data are restored by the video decoder 222, the audio decoder 224, and the additional data processing unit 225, respectively. The video decoder 222, the audio decoder 224, and the additional data processing unit 225 may restore the signals with a decoding format that corresponds to an encoding format when the broadcast signal is transmitted.

A decoded video signal may be converted by the video processing unit 223 to fit the vertical frequency, resolution, the screen ratio, and the like corresponding to an output standard of the display unit 230, and a decoded audio signal is output to the speaker 240.

The display unit 230 may include a panel on which an image is displayed, and a panel driving unit controlling driving of the panel.

The user input unit 250 may receive a signal transmitted from the host system HOST. The user input unit 250 may receive data for selection of instructions related to communication with other display devices by the user and data input, as well as data related to the selection of a channel transmitted by the host system HOST, and selection and manipulation of a user interface (UI) menu.

The HDD 260 stores various software programs including an OS program, a recorded broadcast program, a moving picture, a photo, and other data. The HDD 260 may be formed of a storage medium such as a hard disk or a nonvolatile memory.

The network communication unit 270 may perform short-range communication with the host system HOST and the other display devices, and may be implemented with a communication module including an antenna pattern that may implement mobile communication, data communication, Bluetooth, RF, Ethernet, and the like.

The network communication unit 270 may transmit and receive wireless signal with at least one of a base station, an external terminal, and a server on a mobile communication network built according to technical standards or a communication method (for example, global system for mobile communication (GSM), code division multi access (CDMA), code division multi access 2000 (CDMA2000), enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTE-A), 5G, or the like) for mobile communication through an antenna pattern to be described below.

The network communication unit 270 may transmit and receive a wireless signal through a communication network according to wireless Internet technologies through the antenna pattern to be described below. The wireless Internet technologies may include, for example, wireless LAN (WLAN), wireless-fidelity (Wi-Fi), wireless fidelity (Wi-Fi) direct, digital living network alliance (DLNA), wireless broadband (WiBro), world interoperability for microwave access (WiMAX), high speed downlink packet access (HSDPA), high speed uplink packet access (HSUPA), long term evolution (LTE), long term evolution-advanced (LTE-A), and the like, and the antenna pattern may transmit and receive data according to at least one wireless Internet technology including those not listed above.

The UI generation unit 280 may generate a UI menu for communication with the host system HOST and the other display devices, and may be implemented by an algorithm code and an OSD IC. The UI menu for communication with the host system HOST and the other display devices DV2 to DV4 may be a menu for designating a counterpart digital TV for communication and selecting a desired function on the digital TV.

The control unit 290 may perform overall control of the first display device 11 and may control communication with of the host system HOST and the second to fourth display devices 12, 13, and 14. The corresponding algorithm code for control is stored, and the control unit 290 may be implemented by a micro controller unit (MCU) in which the stored algorithm code is executed.

The control unit 290 controls to transmit a corresponding control instruction and data to the host system HOST and the second to fourth display devices 12, 13, and 14 through the network communication unit 270 according to an input and selection of the user input unit 250. In case that a selected control instruction and data are input from the host system HOST and the second to fourth display devices 12, 13, and 14, an operation is performed according to the corresponding control instruction.

Since a block diagram of the second display device 12, a block diagram of the third display device 13, and a block diagram of the fourth display device 14 are substantially the same as the block diagram of the first display device 11 described with reference to FIG. 10, their descriptions are omitted.

Figure 11:
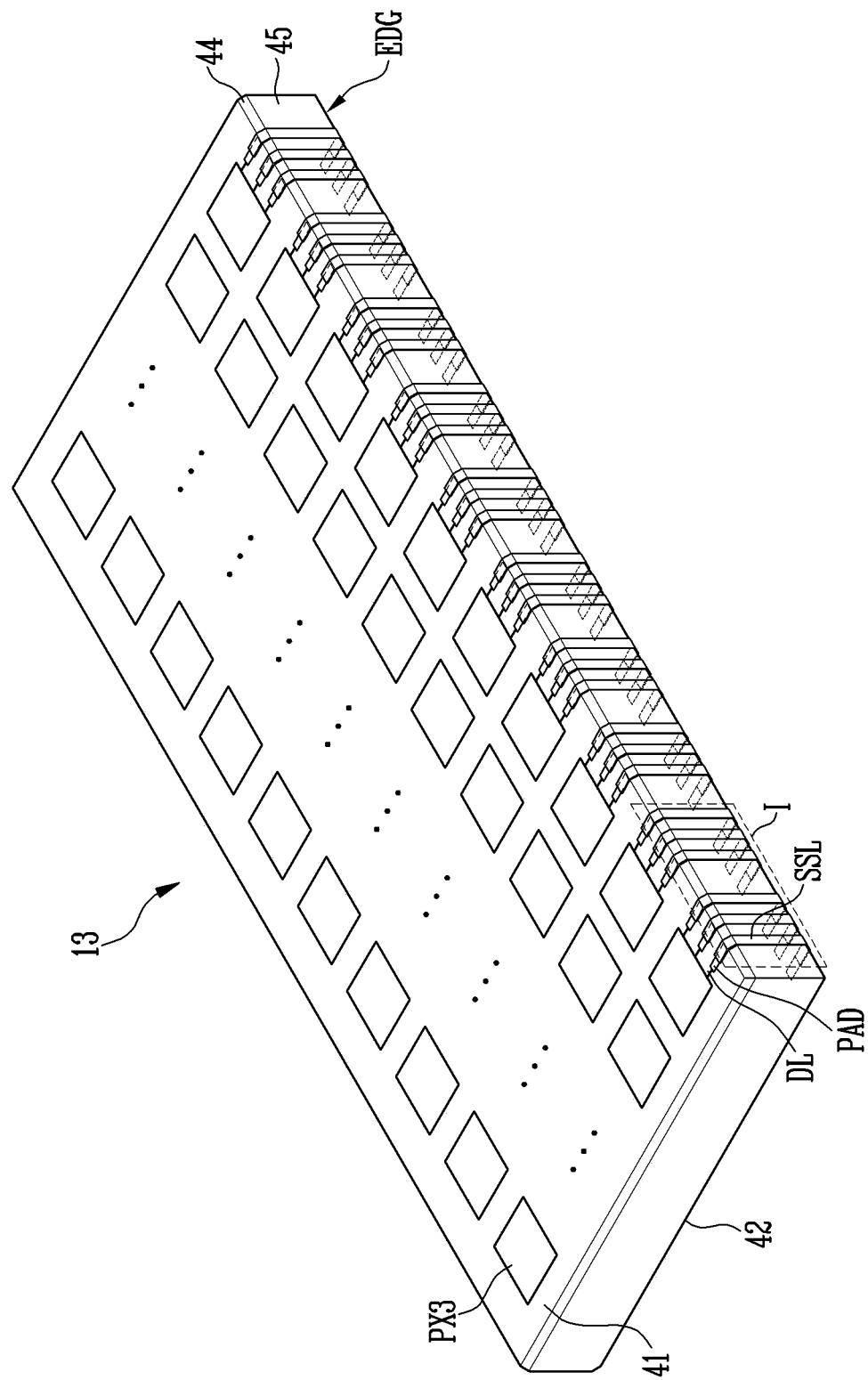
FIG. 11 is a schematic perspective view illustrating a display device having a side surface line according to an embodiment.
Figure 12:
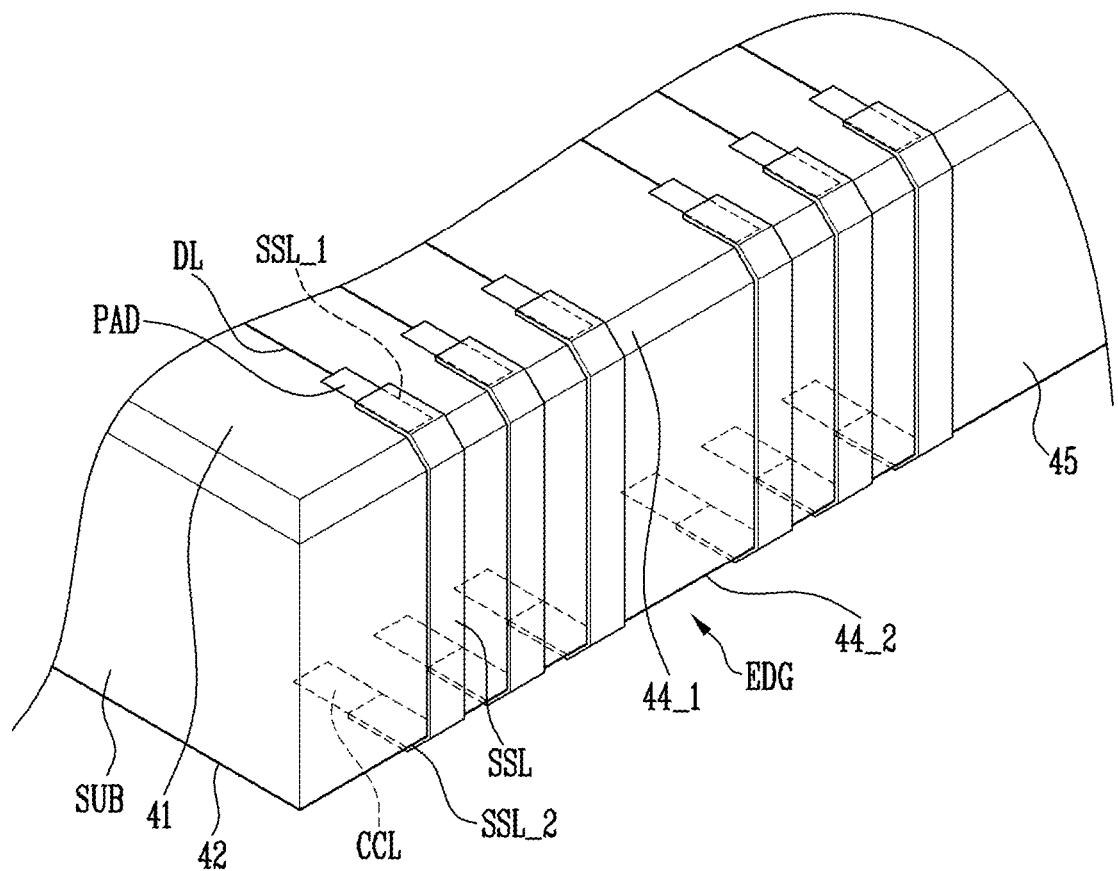
FIG. 12 is an enlarged schematic perspective view illustrating a portion I shown in FIG. 11.

FIG. 11 is a schematic perspective view illustrating a display device having a side surface line according to an embodiment. FIG. 12 is an enlarged schematic perspective view illustrating a portion I shown in FIG. 11. The first coating pattern and the second coating pattern are omitted in FIGS. 11 and 12 for convenience of description.

Referring to FIG. 11, pads PAD may be formed at a selected distance along an edge area EDG on the substrate SUB of the third display device 13 in FIGS. 5, 6, and 8. The pads PAD may be electrically connected to the third pixels PX3 through the data line DL formed on the first surface 41 of the substrate SUB, respectively. In FIG. 11, only the data line DL is shown, but the pad PAD may be electrically connected to the third pixels PX3 through a gate line (not shown). The number of pads PAD formed in the edge area EDG may vary according to the number of third pixels PX3 implemented on the substrate SUB.

The edge area EDG of the substrate SUB may be the outermost portion of the substrate. The edge area EDG of the substrate SUB may include a first area corresponding to the second side surface 45 of the substrate SUB, a second area adjacent to the second side surface 45 and the first surface 41 of the substrate SUB, and a third area adjacent to the second side surface 45 and the second surface 42 of the substrate SUB. The edges of the substrate SUB may be chamfered to form the chamfer surface 44 having a selected angle in the edge area EDG. The chamfer surface 44 may be formed at an edge between the first surface 41 and the second side surface 45 of the substrate and an edge between the second surface 42 and the second side surface 45 of the substrate SUB.

Side surface lines SSL may be formed in the edge area EDG of the substrate SUB. A width of the side surface lines SSL may be several tens of μm, and a distance between adjacent side surface lines SSL may be several tens of μm. A width of each side surface line SSL may be equal to or greater than a distance between adjacent side surface lines.

Referring to FIG. 12, the side surface lines SSL are formed at a regular distance in the edge area EDG. One end SSL_1 of each side surface line SSL may be electrically connected to the pad PAD disposed in the second area of the edge area EDG, and another end SSL_2 of the edge area EDG may be electrically connected to the connection line CCL disposed in the third area of the edge area EDG.

Each of a first chamfer surface 44_1 and a second chamfer surface 44_2 may be formed in the edge area EDG of the substrate SUB. For example, the first chamfer surface 44_1 may be formed by chamfering an edge adjacent to the first surface 41 and the second side surface 45 of the substrate SUB. The second chamfer surface 44_2 may be formed by chamfering an edge adjacent to the second surface 42 and the second side surface 45 of the substrate SUB. Accordingly, the first chamfer surface 44_1 is positioned between the first area and second area of the edge area, and the second chamfer surface 44_2 is positioned between the first area and third area of the edge area.

The other end SSL_2 of each side surface line SSL may be electrically connected to the connection line CCL, another connection pad (not shown), or another driver (not shown) formed in the third area of the edge area EDG.

Figure 13:
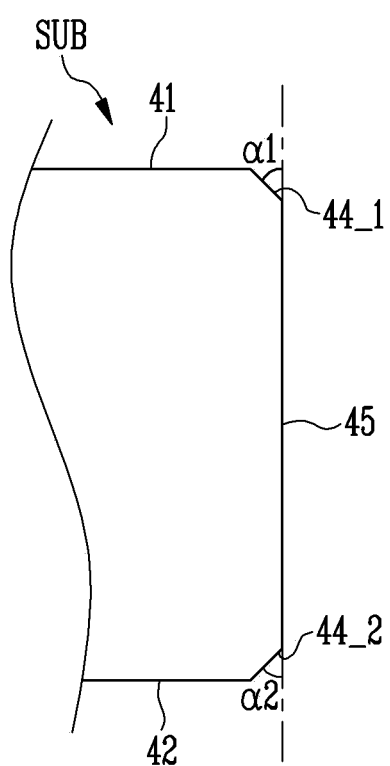
FIG. 13 is a schematic diagram illustrating an angle of a chamfer surface formed in an edge area corresponding to each of a first surface and a second surface of a substrate.

FIG. 13 is a diagram illustrating an angle of the chamfer surface formed in the edge area corresponding to each of the first surface and the second surface of the substrate.

Referring to FIG. 13, the first chamfer surface 44_1 may be formed at a first angle α1 with respect to the first surface 41 of the substrate SUB, and the second chamfer surface 44_2 may be formed at a second angle α2 with respect to the second surface 42 of the substrate SUB.

The first angle α1 may be an acute angle, and may be an angle close to approximately 45 degrees, for example, 45 degrees±10 degrees. The second angle α2 may be similar to the first angle 1, and may be an angle close to approximately 45 degrees, for example, 45 degrees±25 degrees.

For example, the first and second chamfer surfaces 44_1 and 44_2 may form the first angle α1 and the second angle α2 at the same angle to form symmetry with each other in consideration of processing efficiency. Both of the first and second angles α1 and α2 may be set to 45 degrees, or both of the first and second angles α1 and 2 may be set to acute angles and may be set to the same angle.

However, it is not necessary to form the first and second angles α1 and α2 at the same angle, and it is possible to form the first and second angles α1 and α2 differently according to the conditions and the environment in which the substrate SUB is installed.

As the first and second chamfer surfaces 44_1 and 44_2 are formed in the edge area EDG of the substrate SUB, handling of the substrate SUB may be improved as follows.

In a case where the chamfer surfaces 44_1 and 44_2 do not exist in the edge area EDG of the substrate SUB, when the edge of the substrate SUB comes into contact with a substrate fixing jig (not shown) when aligning or fixing the substrate SUB, damage such as chipping is likely to occur at an edge having a sharp right angle shape. However, when the first and second chamfer surfaces 44_1 and 44_2 are formed in the edge area EDG as in the embodiments, since the sharp right angle shape is removed from the edge area EDG, even though the edge area EDG comes into contact with the jig, the possibility of damage may be reduced.

In case that the substrate SUB is dropped, without the chamfer surfaces 44_1 and 44_2, the substrate SUB may be deformed, and chipping may occur at the sharp right angle shape of the edge area EDG when substrate SUB collides with a bottom surface. However, in case that the chamfer surface is provided in the edge area EDG, the frequency of chipping may be reduced.

Heat deformation rates of the substrate SUB of a glass material and the side surface line SSL of FIG. 9 of a metal material are different from each other. Accordingly, in case that the chamfer surfaces 44_1 and 44_2 are not provided in the edge area EDG, the side surface line may be lifted when a portion of the side surface line existing on the first surface 41 of the substrate SUB and a portion of the side surface line existing on the second side surface 45 of the substrate SUB expands due to a difference of the heat deformation rates between the substrate SUB and the side surface line. Adhesion force between the substrate SUB and the side surface line may be reduced, and thus a crack may occur in the side surface line over time.

However, as in an embodiment, in case that the chamfer surfaces 44_1 and 44_2 are provided in the edge area EDG, stress concentration generated by the chamfer surfaces 44_1 and 44_2 may be low, reduction of the adhesion force of the side surface line that is in close contact with the substrate SUB may be prevented. Thus occurrences of cracks in the side surface line may be reduced.

Figure 14:
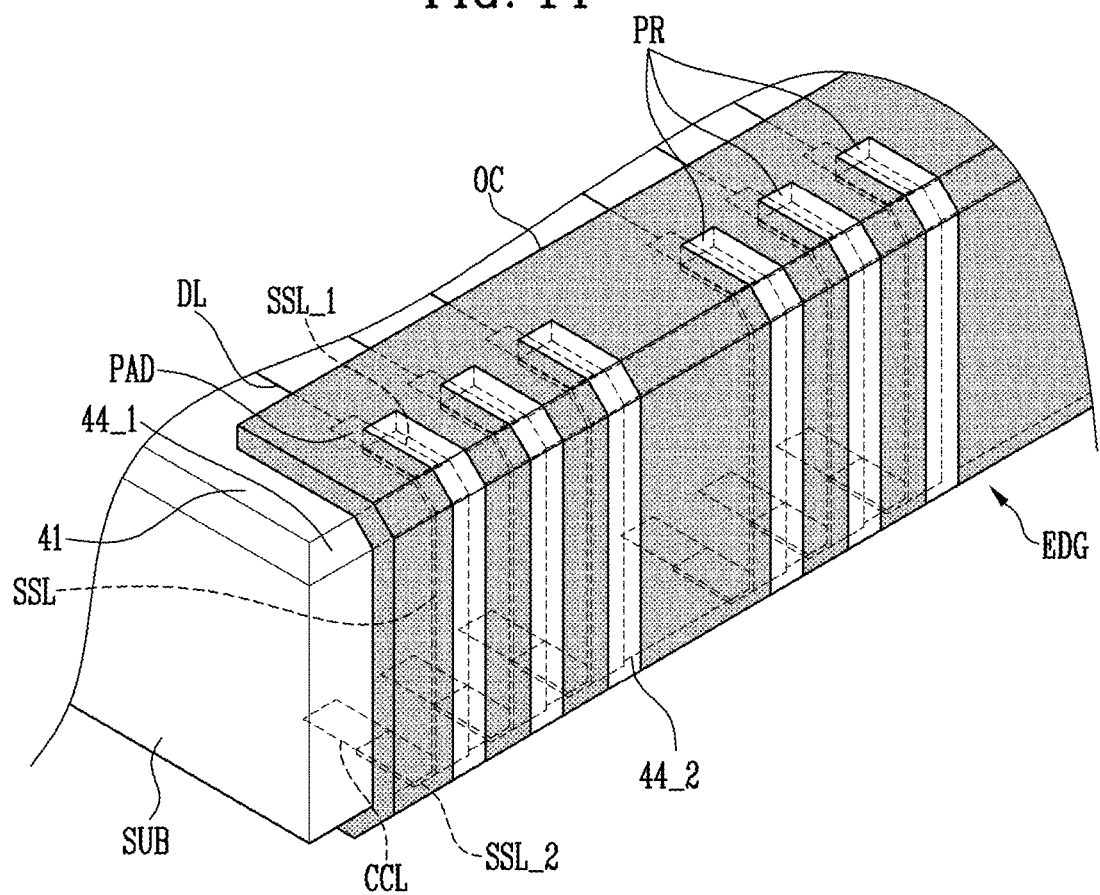
FIG. 14 is a schematic perspective view illustrating a first coating pattern and a second coating pattern covering the side surface line formed in the edge area of the substrate.

FIG. 14 is a perspective view illustrating an example in which the first coating pattern and the second coating pattern covering the side surface line are formed in the edge area of the substrate.

The side surface lines SSL may be formed with a very fine thickness in which a width is several tens of μm, and a thickness is several μm. Therefore, the side surface lines SSL may be easily damaged by an external structure during various processes such as movement or assembly of the substrate SUB.

Referring to FIG. 14, the first coating pattern PR and the second coating pattern OC formed of an insulating material may be formed in the edge area EDG to protect the side surface lines SSL. The first coating pattern PR and the second coating pattern OC according to an embodiment may be formed of the same material. For example, the first coating pattern PR and the second coating pattern OC may include a photoresist and a light blocking material. The photoresist may include a binder including a photosensitive polymer. The light blocking material may include a black pigment for expressing black. The black pigment may include carbon black, titanium black, and the like. The first coating pattern PR and the second coating pattern OC may further include a dispersing agent for evenly dispersing the black pigment in the photoresist. However, the embodiments are not limited to forming the first coating pattern PR and the second coating pattern OC with the same material.

The first coating pattern PR may be formed to completely cover an upper surface of the side surface line SSL. The second coating pattern OC may be formed to completely cover a side surface of the side surface line SSL and a side surface of the first coating pattern PR.

According to an embodiment, the second coating pattern OC may be formed to cover a portion of an edge of an upper surface of the first coating pattern PR. The height from the first surface 41 of the substrate SUB to the upper surface of the first coating pattern PR may be substantially the same as a height from the first surface 41 to an upper surface of the second coating pattern OC, but a height from the first surface 41 to the upper surface of the second coating pattern OC formed near the edge of the upper surface of the first coating pattern PR may be higher than the height from the first surface 41 to the upper surface of the first coating pattern PR.

Hereinafter, after a display panel manufacturing process according to the disclosure is schematically described, manufacturing processes according to various embodiments of the side surface line formed on the side surface of the substrate is described in detail.

Figure 15A:
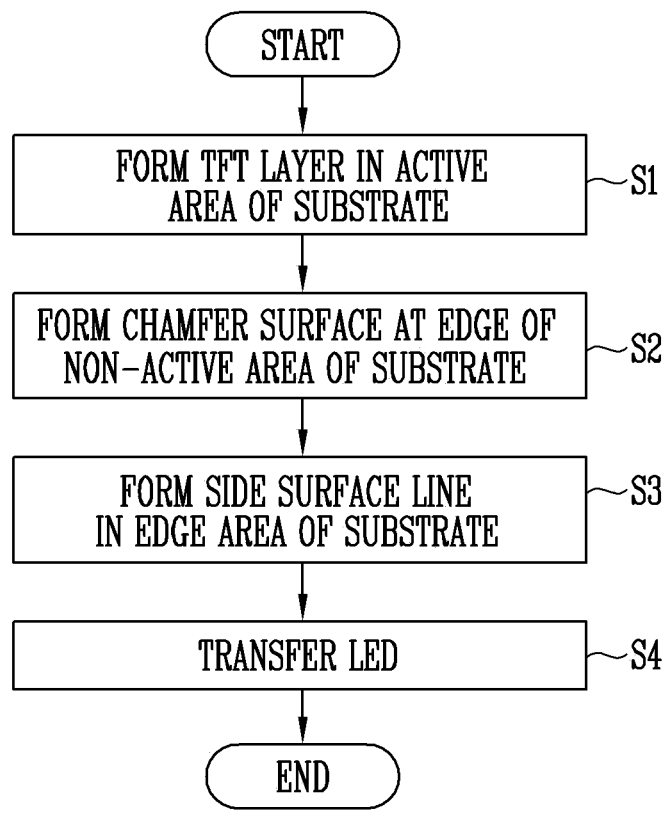
FIG. 15A is a flowchart illustrating a main display panel manufacturing process according to the disclosure.
Figure 15B:
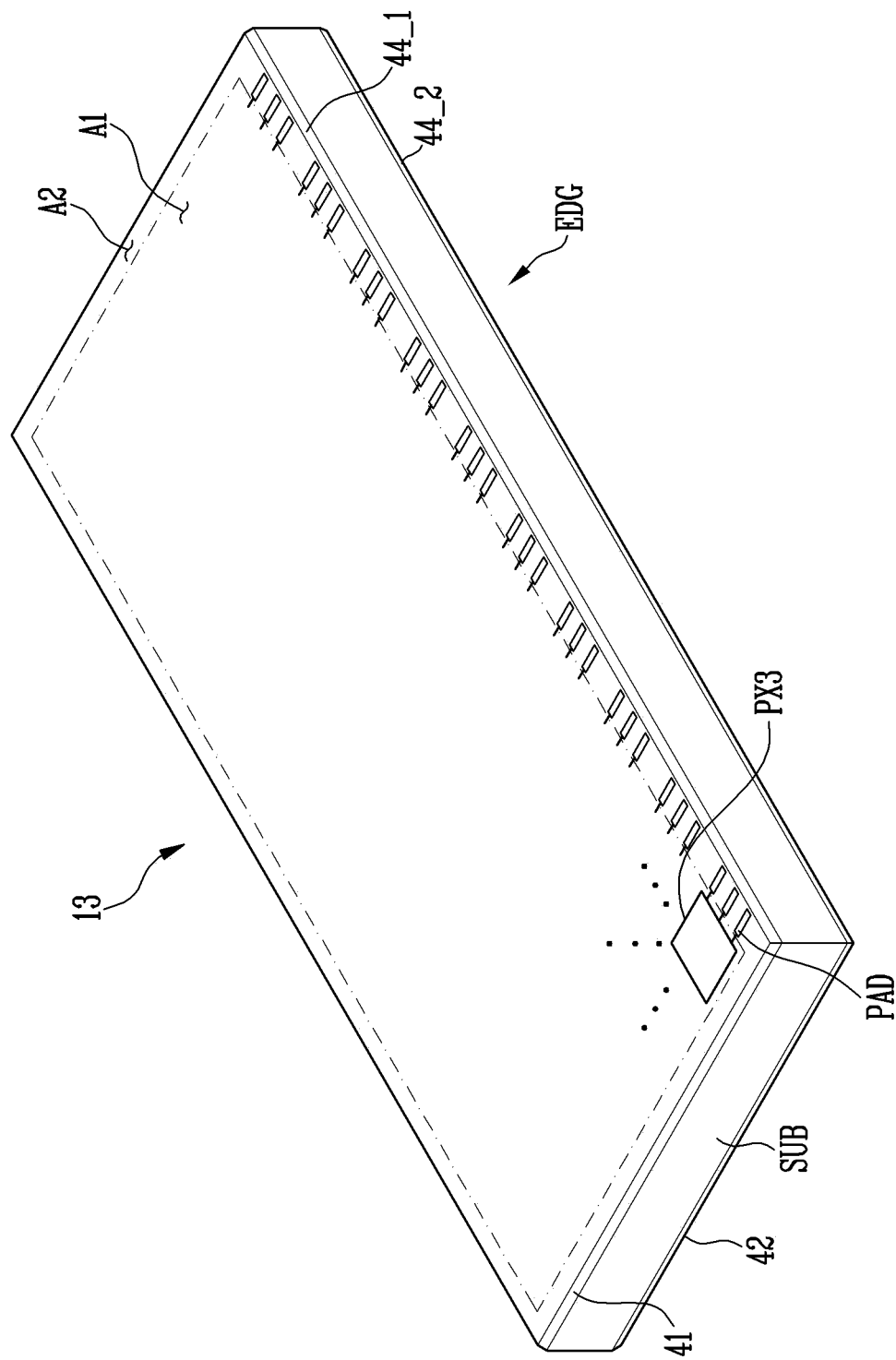
FIG. 15B is a schematic diagram illustrating an active area and a non-active area on the substrate.

FIG. 15A is a flowchart illustrating a main display panel manufacturing process according to the disclosure, and FIG. 15B is a schematic diagram illustrating an active area and a non-active area on the substrate.

Referring to FIG. 15A, the thin film transistor layer TFTL may be formed on the first surface 41 of the substrate SUB (refer to S1 of FIG. 15A). Hereinafter, for convenience, the description is based on the third display device 13.

Referring to FIG. 15B, in the first surface 41 of the substrate SUB, an area where the thin film transistor layer TFTL of FIG. 4 on which the third pixel PX3 (or the light emitting element LE of FIG. 4) is mounted is formed may be defined as an active area A1, and an area except for the active area A1 may be defined as a non-active area A2. The non-active area A2 may be an edge portion of the first surface 41 of the substrate SUB by including an area where the pads PAD are disposed.

After the thin film transistor layer is formed on the first surface 41 of the substrate SUB, an edge included in the non-active area A2 of the substrate SUB may be processed to form the chamfer surfaces 44_1 and 44_2 (refer to S2 of FIG. 15A).

The chamfer surfaces 44_1 and 44_2 may be formed at each edge of the edge area EDG of the substrate SUB.

After the chamfer surfaces 44_1 and 44_2 are formed, the side surface lines SSL (refer to FIG. 11) respectively and electrically connected to the pads PAD disposed in the non-active area A2 may be formed (refer to S3 of FIG. 15A).

As described above, when the side surface lines SSL are formed in the edge area EDG of the substrate SUB, the light emitting elements may be transferred from the transfer substrate on which the light emitting elements LE are arranged to the thin film transistor layer TFTL of the substrate SUB (refer to S4 of FIG. 15A). The light emitting element LE transfer process may be performed through a transfer method such as laser transfer, pick and place transfer, and roll transfer.

Hereinafter, a process of forming the side surface lines SSL in the edge area EDG of the substrate SUB is sequentially described with reference to FIGS. 16 and 17A to 17P.

Figure 16:
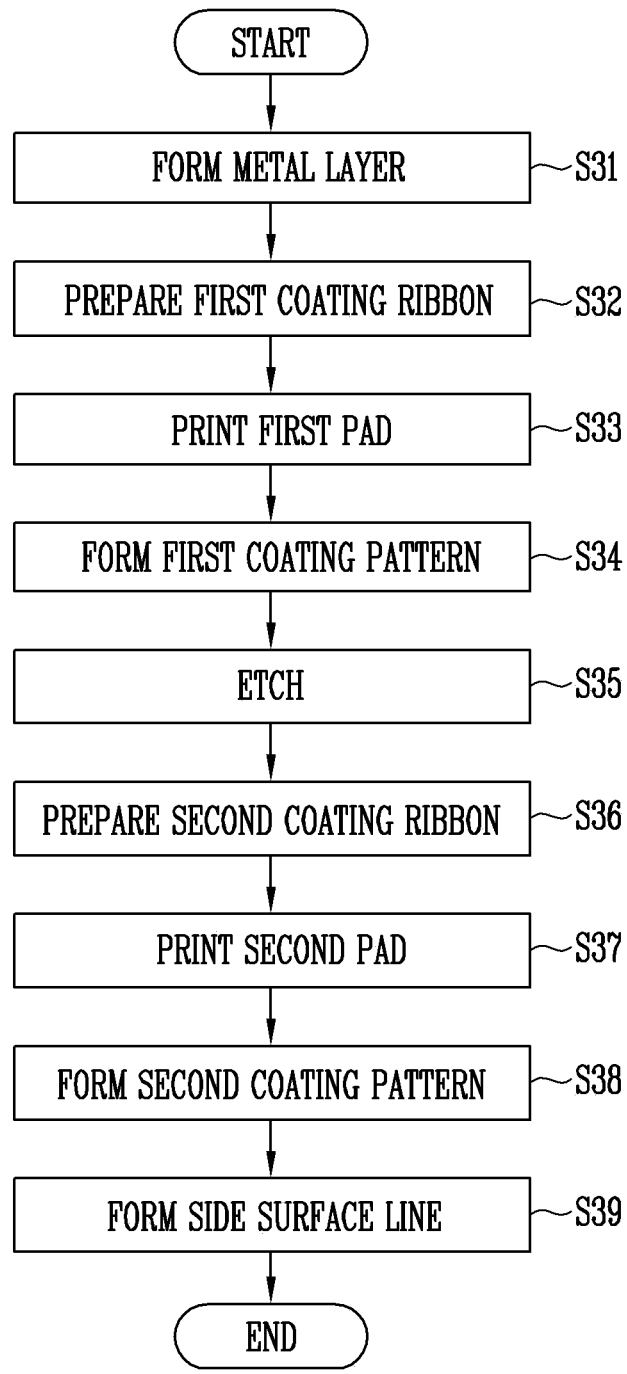
FIG. 16 is a flowchart illustrating a method of forming a side surface line according to an embodiment.

FIG. 16 is a flowchart illustrating a method of forming a side surface line according to an embodiment. FIGS. 17A to 17P are diagrams sequentially illustrating a process of forming a side surface line SSL on a substrate SUB according to an embodiment.

Referring to FIG. 16, a metal layer may be formed on the edge area EDG of the substrate SUB (refer to S31 of FIG. 16).

Figure 17A:
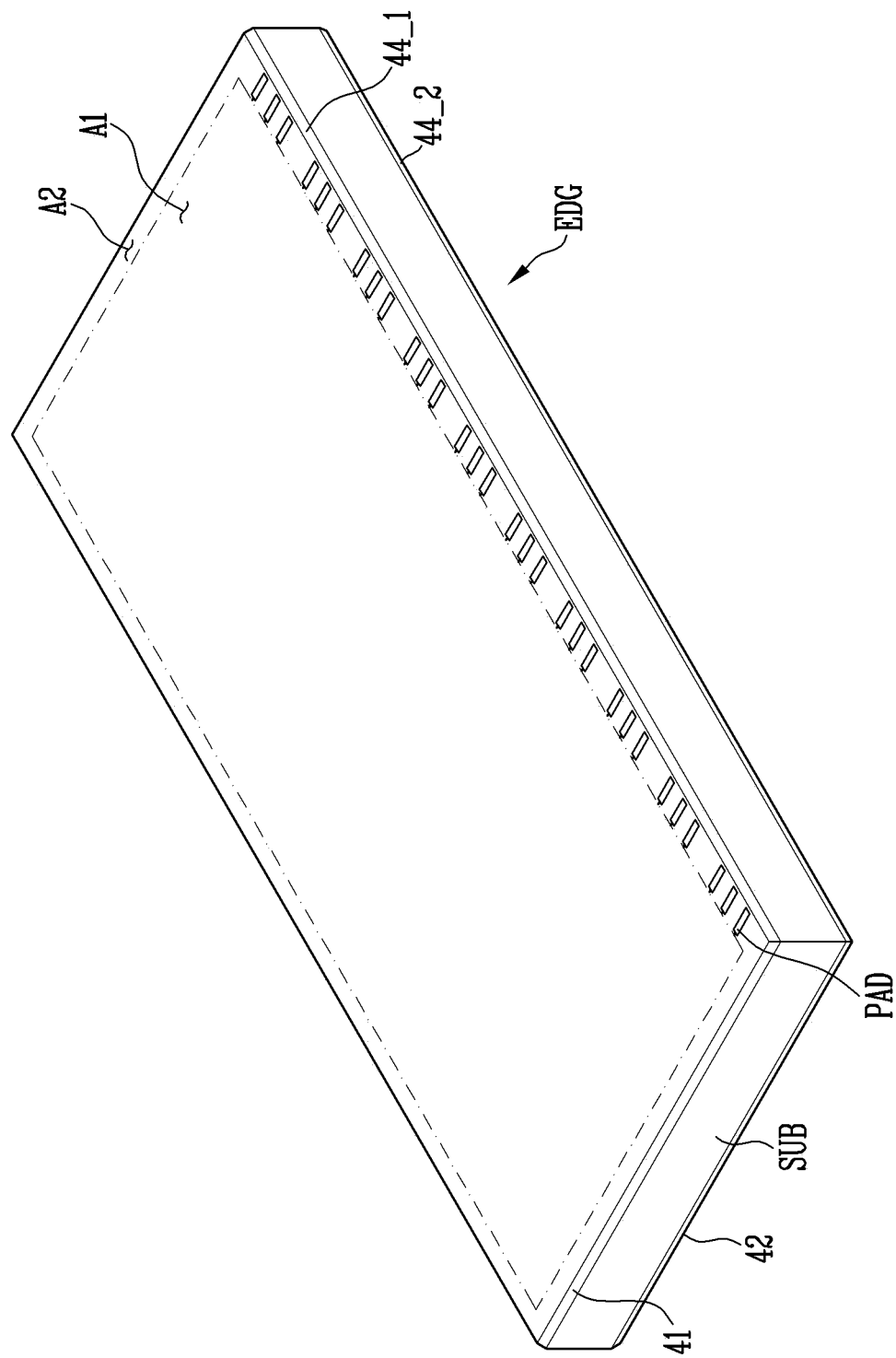
FIGS. 17A to 17P are schematic diagrams sequentially illustrating a process of forming a side surface line on a substrate according to an embodiment.

Referring to FIG. 17A, the substrate SUB may be prepared in a state in which the thin film transistor layer TFTL of FIG. 4 is formed in the active area A1, the pad PAD is formed in the non-active area A2, and the chamfer surfaces 44_1 and 44_2 are formed at the edge of the non-active area A2.

Figure 17B:
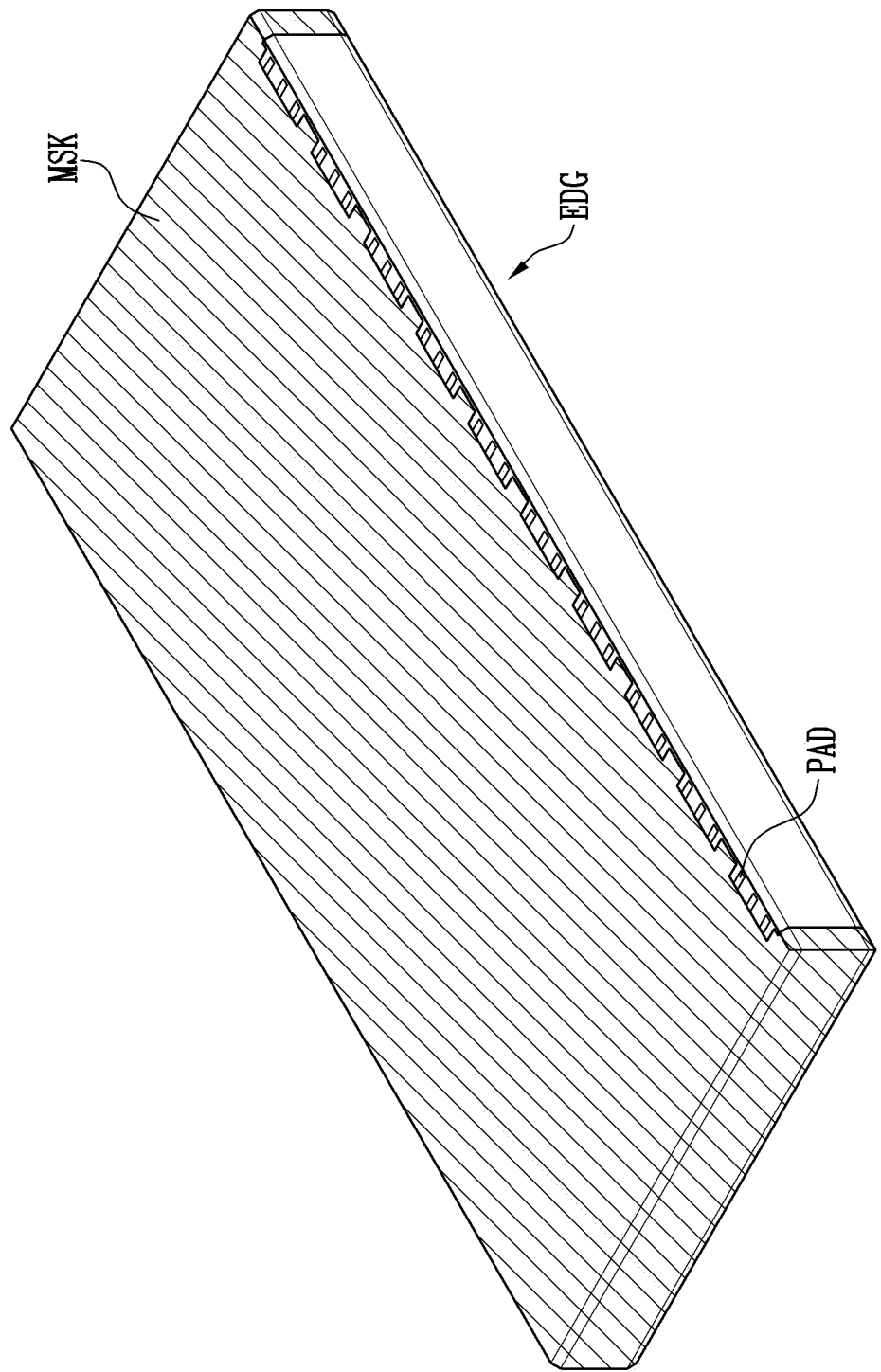

Referring to FIG. 17B, a masking layer MSK may be formed in a remaining area of the substrate SUB except for the edge area EDG of the substrate SUB.

The masking layer MSK may be formed to cover most of the substrate SUB except for the edge area EDG where the side surface line SSL is to be formed. The masking layer MSK may be formed of an adhesive tape of a film shape that may be easily separated from the substrate SUB, or may be formed by applying a masking ink.

Figure 17C:
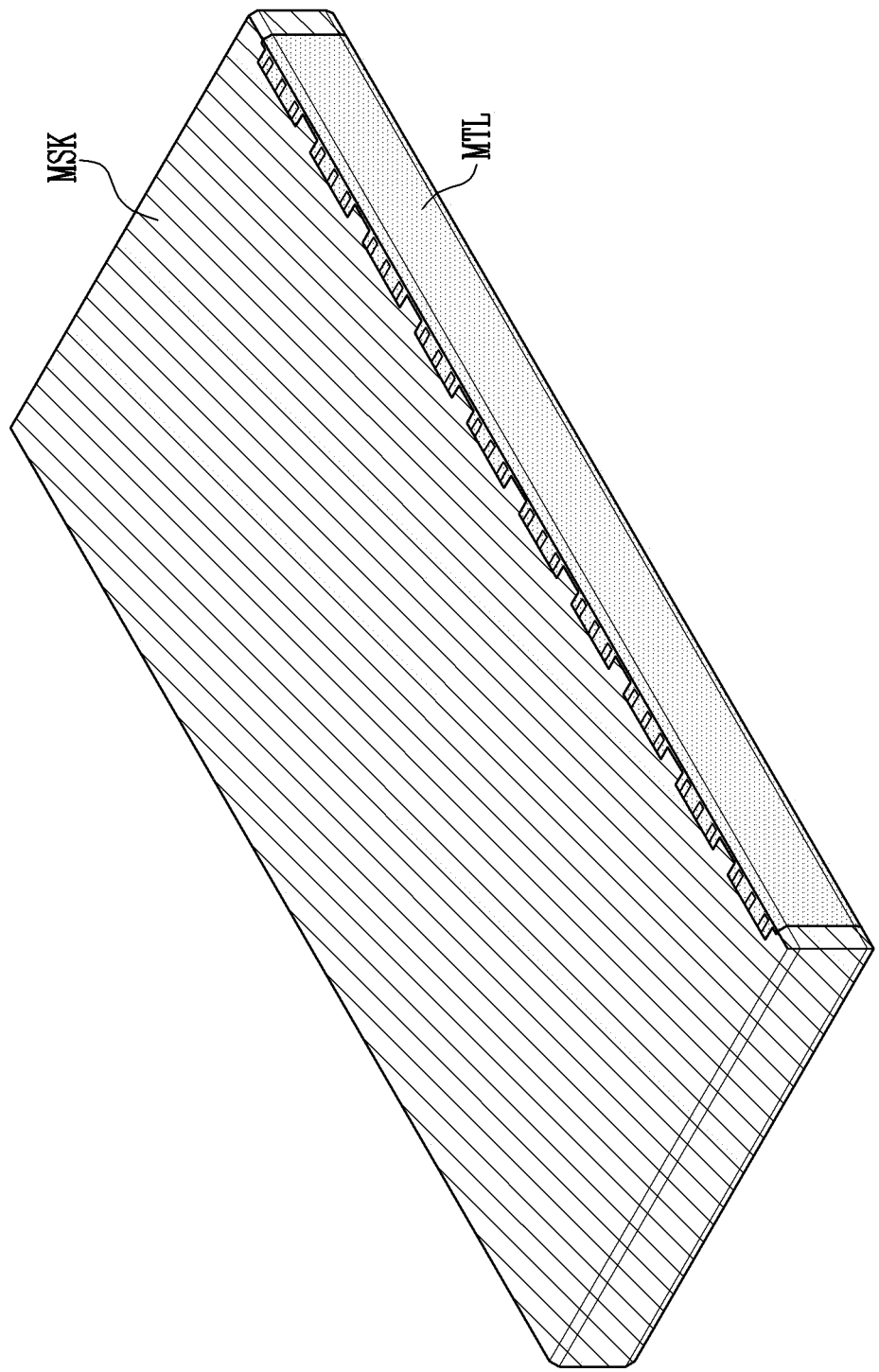

Referring to FIG. 17C, the substrate SUB that is not covered by the masking layer MSK may be placed in a vacuum chamber (not shown), and a metal layer MTL of a selected thickness may be formed in the edge area EDG through a sputtering process in a vacuum atmosphere.

The metal layer MTL may include copper and titanium. For example, the metal layer MTL may have a double layer structure of copper/titanium. However, the materials of the metal layer MTL is not limited thereto. For example, the metal layer MTL may include at least one metal including copper (Cu), molybdenum (Mo), tungsten (W), aluminum neodymium (AlNd), titanium (Ti), aluminum (Al), and silver (Ag), or an alloy of these metals. In other examples, the metal layer MTL may include a transparent conductive material. For example, the transparent conductive material may include ITO, IZO, ZnO, IGZO, ITZO, and the like. The metal layer MTL may be formed as a single layer structure or a multiple layer structure.

Figure 17D:
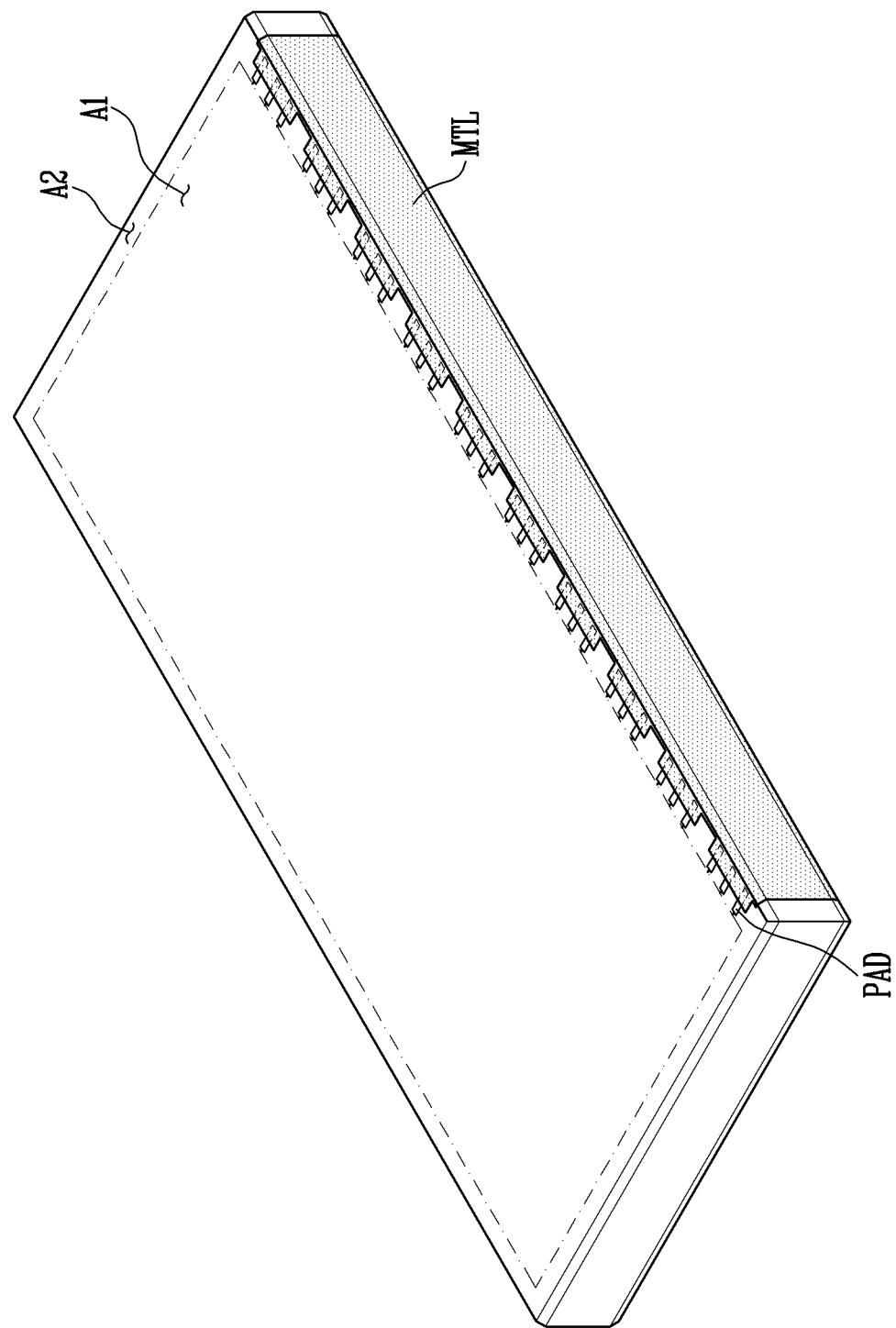

Referring to FIG. 17D, in case that the formation of the metal layer MTL is completed, the masking layer MSK may be removed from the substrate SUB.

Figure 17E:
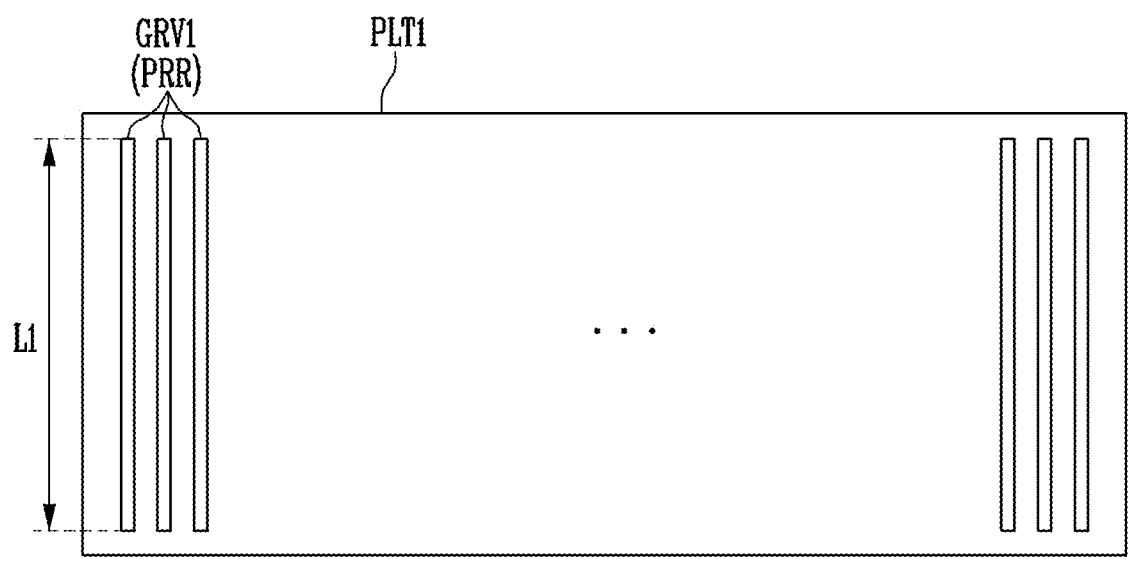

Referring to FIG. 17E, an ink transfer first plate PLT1 having first concave portions GRV1 in which the same pattern as a first coating ribbon PRR is formed is prepared. An ink may be applied to the first concave portion GRV1 of the ink transfer first plate PLT1 and a printing pad MOLD of FIG. 17F may be pressed against the ink transfer first plate PLT1 to transfer the ink applied to the ink transfer first plate PLT1 to the printing pad MOLD. The ink may include a photoresist and a black pigment. The black pigment may include at least one of carbon black and titanium black.

Accordingly, the first coating ribbons PRR may be disposed on one side surface of the printing pad MOLD. The first coating ribbons PRR may be disposed on the printing pad MOLD with a constant width and distance.

In the setting of the width and the setting of the distance of the first coating ribbons PRR disposed on the printing pad MOLD, the setting may be performed in consideration of a distance of the pads PAD disposed adjacent to the first chamfer surface 44_1 along the first surface 41 of the substrate SUB and the connection line CCL disposed adjacent to the second chamfer surface 44_2 along the second surface 42. The first coating ribbons PRR may be formed to have a length L1 sufficient to electrically connect the pad PAD and the connection line CCL.

The printing pad MOLD may have a shape with a selected volume, and may be formed of a soft elastic material (for example, silicone). The printing pad MOLD may have an elastic force at which its shape may be deformed. In case that an external force is applied from the outside, the shape may be deformed and then restored to its original shape when the external force is removed.

Figure 17F:
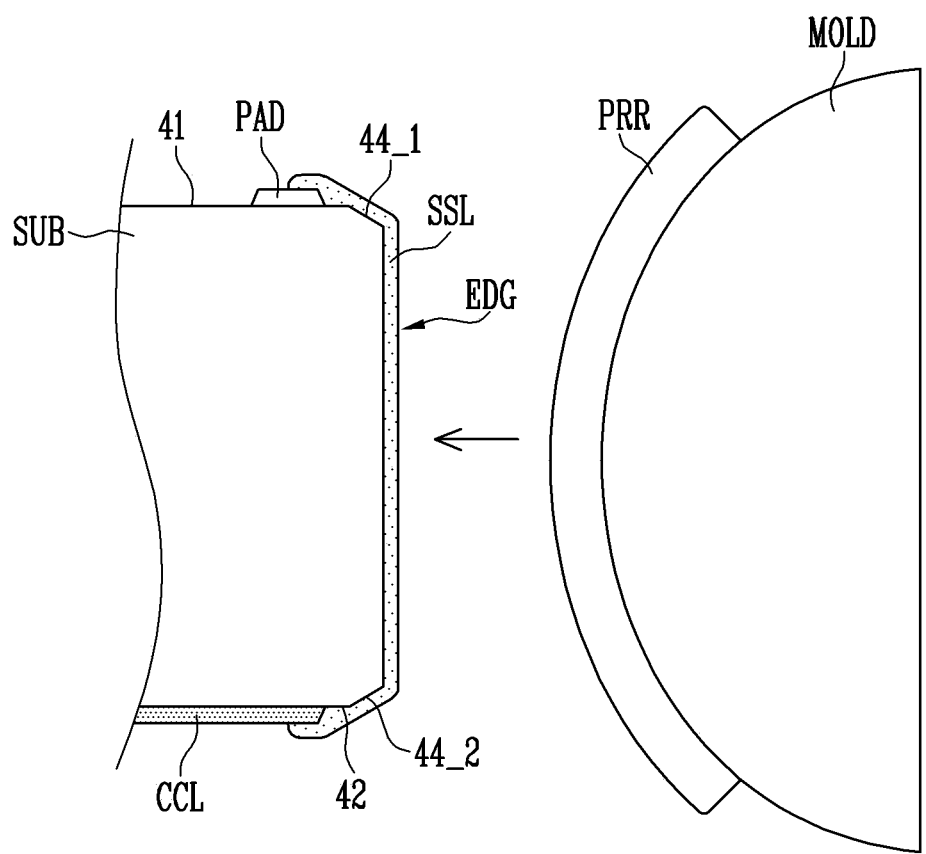
Figure 17G:
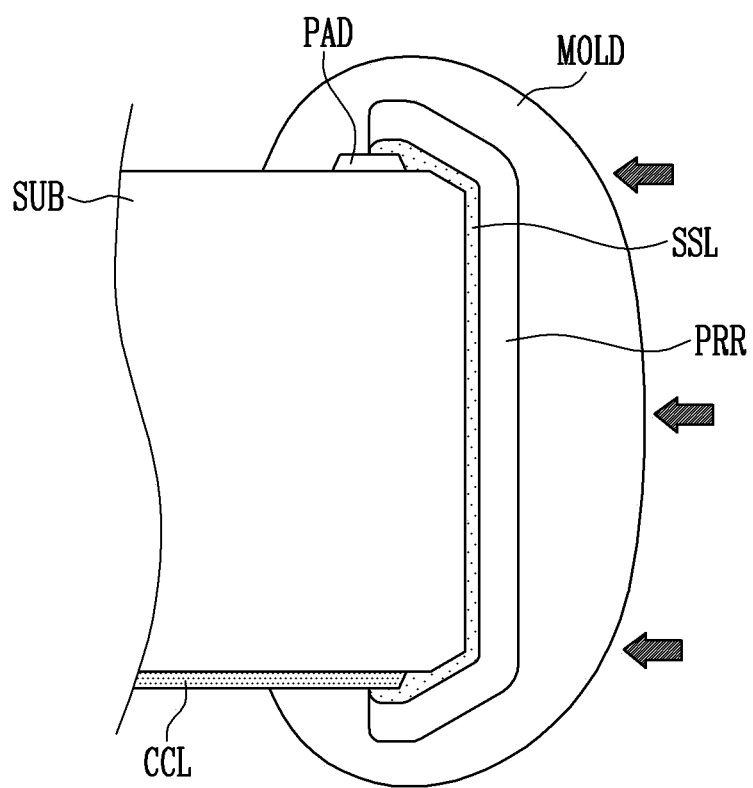

Referring to FIG. 17F, after positioning the printing pad MOLD so that the first coating ribbons PRR face the edge area of the substrate SUB, a pad printing process of positioning the printing pad MOLD to the edge area EDG of the substrate SUB and then pressing the printing pad MOLD with a selected pressure against the edge area EDG of the substrate SUB may be performed. The first coating ribbon PRR may be connected to the PAD and the connection line CCL as shown in FIG. 17G.

Through the pad printing process, the first coating ribbons PRR that are not completely cured, (not sufficiently cured to maintain its shape without flowing down) may be firmly attached to the edge area EDG of the substrate SUB.

Figure 17H:
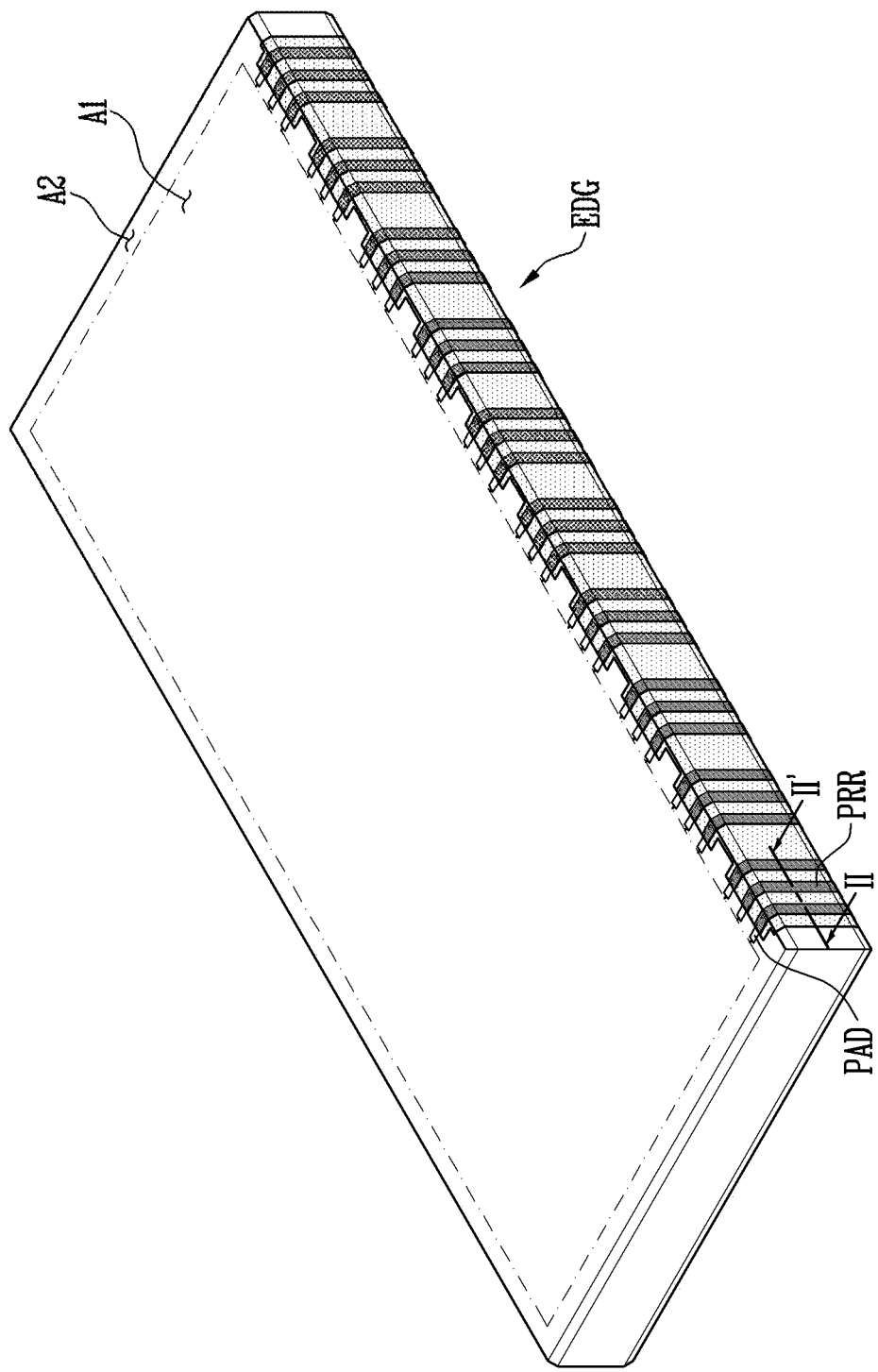

In case that the printing pad MOLD is separated from the edge area EDG of the substrate SUB while removing the pressure applied to the printing pad MOLD, the first coating ribbons PRR may remain on the metal layer MTL in the edge area EDG of the substrate SUB as shown in FIG. 17H.

Thereafter, the metal layer MTL of an exposed portion is removed by an etching process using the cured first coating ribbon PRR as a mask to form the side surface line SSL on the edge area EDG of the substrate SUB.

The etching process for removing the metal layer MTL may be performed by a dry method or a wet method. An example of a dry etching process may be a plasma etching process, and an etchant suitable for the wet etching process may be used according to the type of metal.

Figure 17I:
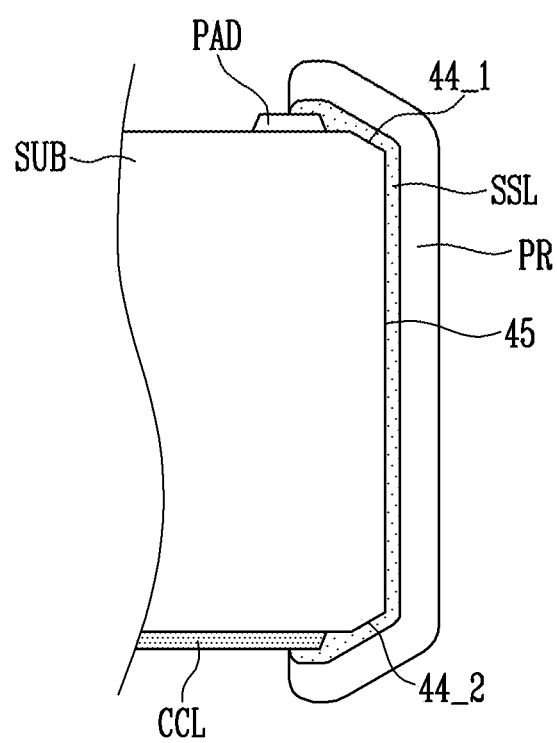

Referring to FIG. 17I, the side surface line SSL and the first coating pattern PR may be sequentially stacked on the side surface (for example, the second side surface 45) of the substrate SUB. The side surface line SSL may physically and electrically connect the pad PAD and the connection line CCL.

Figure 17J:
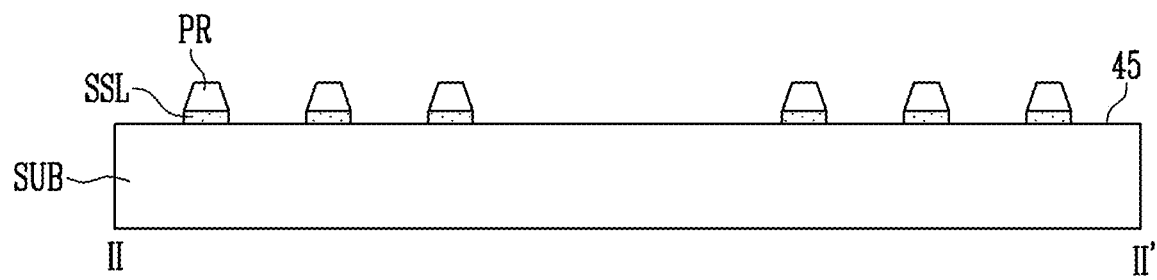

Referring to FIG. 17J, since the first coating ribbon PRR is used as a mask in the etching process, the shape of the side surface line SSL and the first coating pattern PR in a plan view may be substantially the same. A width of the side surface line SSL and a width of the first coating pattern PR may be substantially the same.

However, during the etching process, a cross-section of the first coating pattern PR may have a trapezoidal shape due to a difference of an etching degree, and although not shown in the drawing, during the etching process, since a lower surface of the side surface line SSL may be etched in response to an etchant, the side surface line SSL may include an under-cut portion.

Figure 17K:
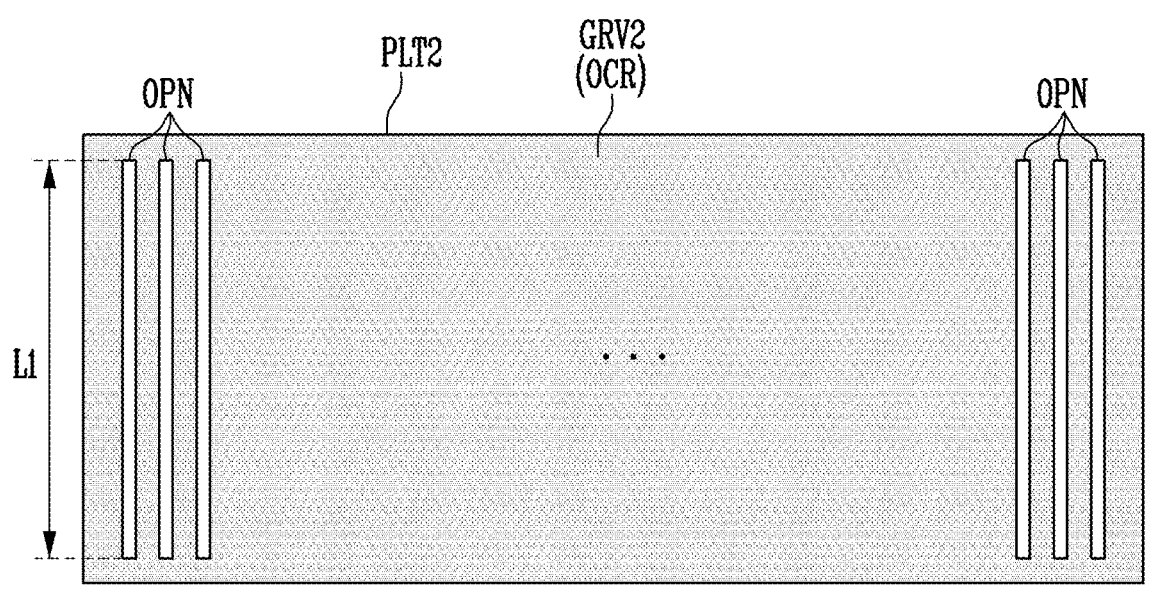

Referring to FIG. 17K, an ink transfer second plate PLT2 having an integral second concave portion GRV2 in which the same pattern as a second coating ribbon OCR is formed is prepared. An ink may be applied to the second concave portion GRV2 of the ink transfer second plate PLT2 and a printing pad MOLD of FIG. 17L may be pressed against the ink transfer second plate PLT2 to transfer the ink applied to the ink transfer second plate PLT2 to the printing pad MOLD. Accordingly, the integral second coating ribbon OCR may be disposed on a side surface of the printing pad MOLD.

The integral second coating ribbon OCR may include openings OPN formed with a constant width and distance. The openings OPN may correspond to the first concave portion GRV1 (or the first coating ribbon PRR) shown in FIG. 17E. A shape of the openings OPN and a shape of the first concave portion GRV1 (or the first coating ribbon PRR) may coincide with each other in a plan view. Accordingly, the second coating pattern OC may not be formed on an upper surface of the first coating pattern PR, generally.

In the positioning of the openings OPN of the integral second coating ribbon OCR disposed on the printing pad MOLD, the positioning may be performed in consideration of a position of the first coating pattern PR. The integral second coating ribbon OCR may be formed to surround an exposed side surface of the side surface line SSL and an exposed pattern of the first coating pattern PR.

The printing pad MOLD may have a shape with a selected volume, and may be formed of a soft elastic material (for example, silicone). The printing pad MOLD may have an elastic force at which its shape may be deformed. In case that an external force is applied from the outside, the shape may be deformed and then restored to its original shape when the external force is removed.

Figure 17L:
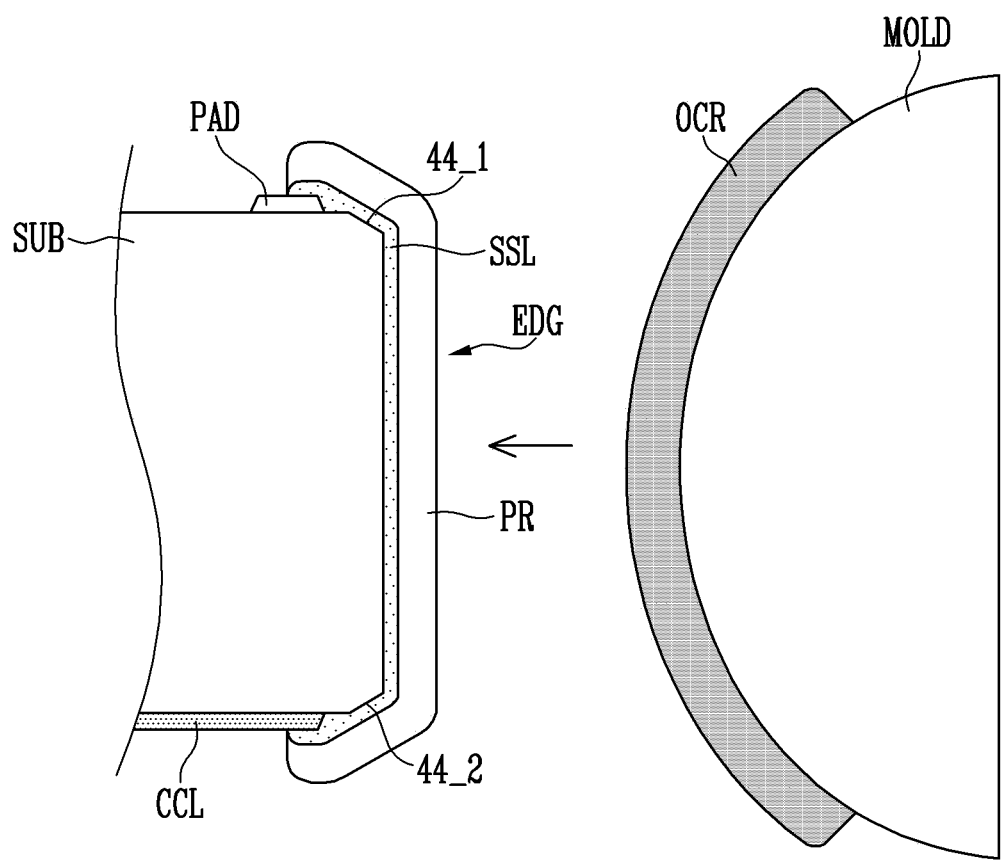
Figure 17M:
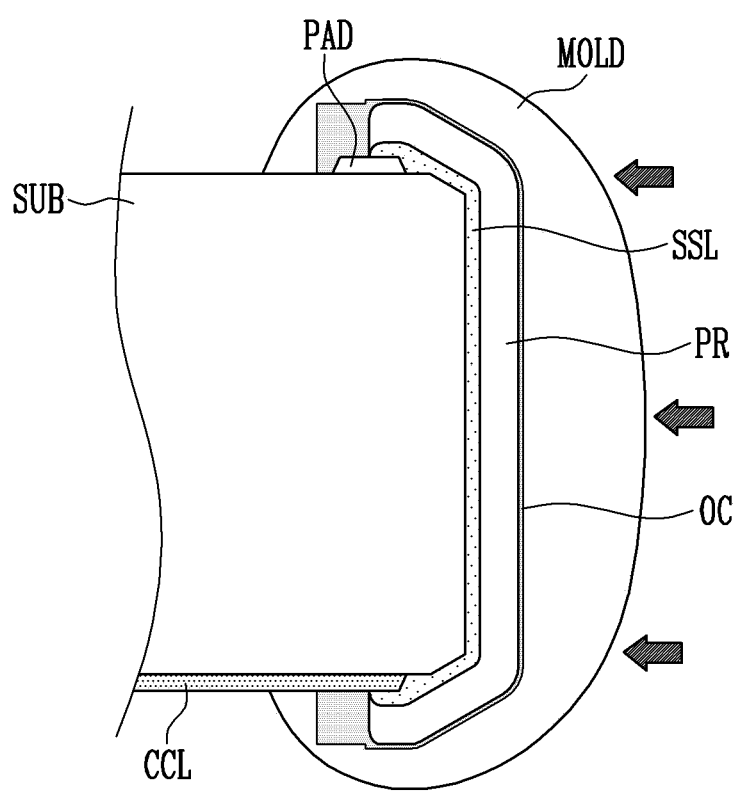

Referring to FIG. 17L, after positioning the printing pad MOLD so that the second coating ribbons OCR face the edge area EDG of the substrate SUB, a pad printing process of positioning the printing pad MOLD to the edge area EDG of the substrate SUB and then pressing the printing pad MOLD with a selected pressure against the edge area EDG of the substrate SUB may be performed. The second coating ribbon OCR completely surrounds side surfaces of each of the side surface line SSL and the first coating pattern PR as shown in FIG. 17M.

Through the pad printing process, the second coating ribbons OCR that are not completely cured (not sufficiently cured to maintain its shape without flowing down) may be firmly attached to the edge area EDG of the substrate SUB.

Figure 17N:
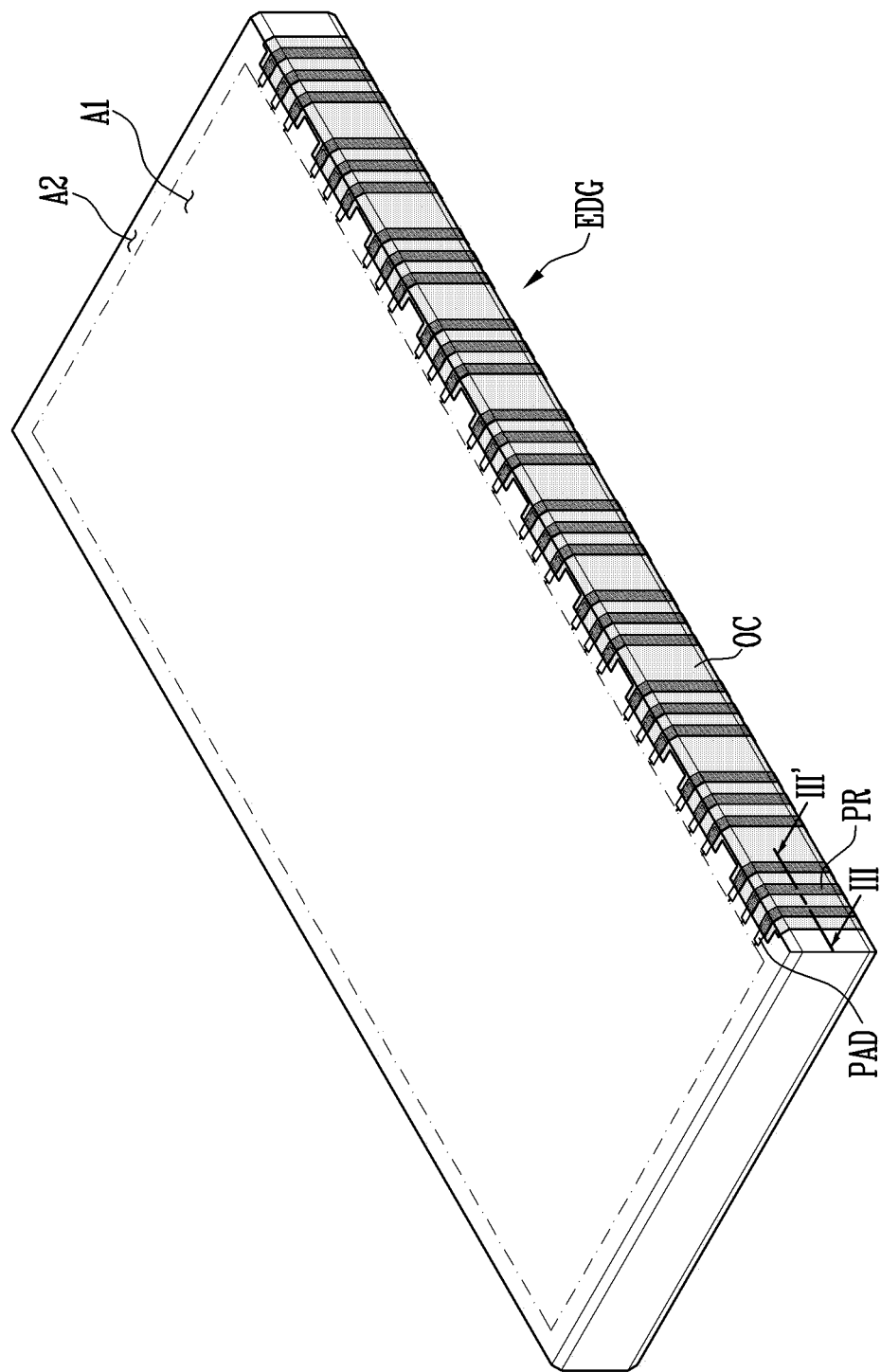
Figure 170:
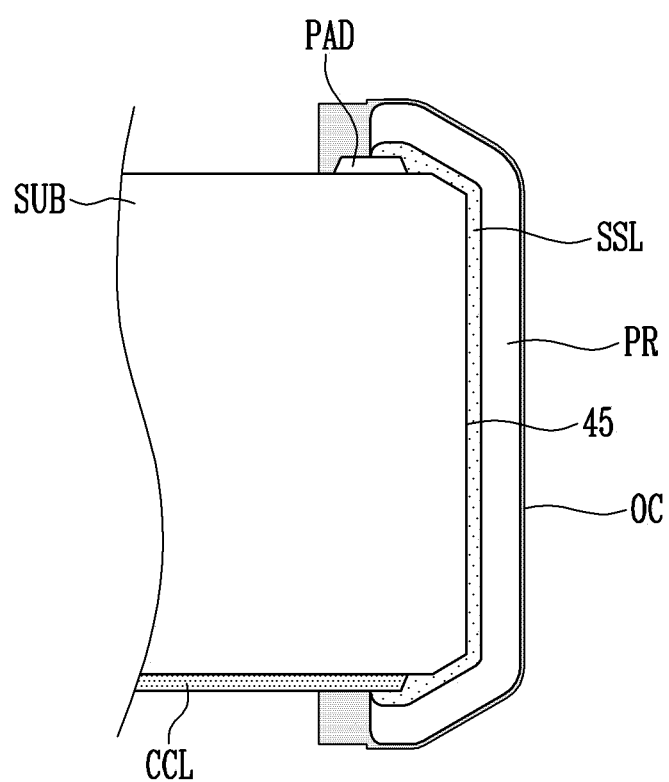
Figure 17P:
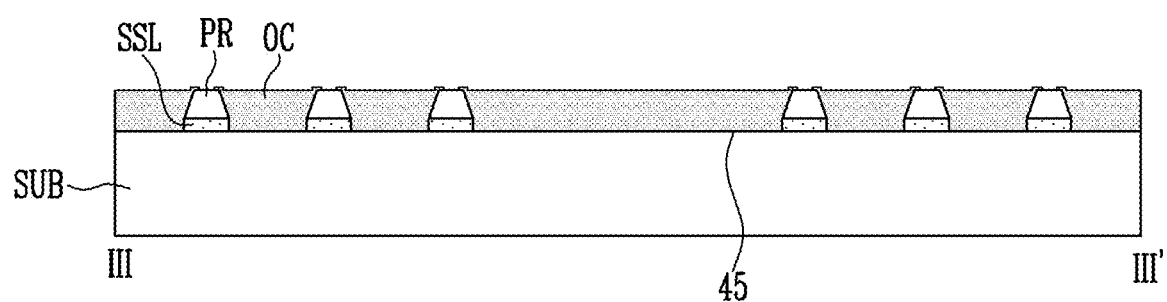

In case that the printing pad MOLD is separated from the edge area EDG of the substrate SUB while removing the pressure applied to the printing pad MOLD, the integral second coating pattern OC may remain on the edge area EDG of the substrate SUB as shown in FIG. 17N. Referring to FIGS. 17O and 17P, the side surface line SSL and the first coating pattern PR may be sequentially stacked on the side surface (for example, the second side surface 45) of the substrate SUB. The side surface line SSL may physically and electrically connect the pad PAD and the connection line CCL. The second coating pattern OC according to an embodiment may be formed to be non-overlapping the first coating pattern PR in the thickness direction. A height from the substrate SUB to an upper surface of the second coating pattern OC may be substantially the same as a height from the substrate SUB to an upper surface of the first coating pattern PR.

However, the disclosure is not limited thereto, and the second coating pattern OC according to an embodiment may be formed to partially overlap the first coating pattern PR in the thickness direction due to a process errors or the like. The height from the substrate SUB to the upper surface of the second coating pattern OC may be generally the same as the height from the substrate SUB to the upper surface of the first coating pattern PR, but the height from the substrate SUB to the upper surface of the second coating pattern OC may be higher than the height from the substrate SUB to the upper surface of the first coating pattern PR in an edge portion of the first coating pattern PR.

Figure 19A:
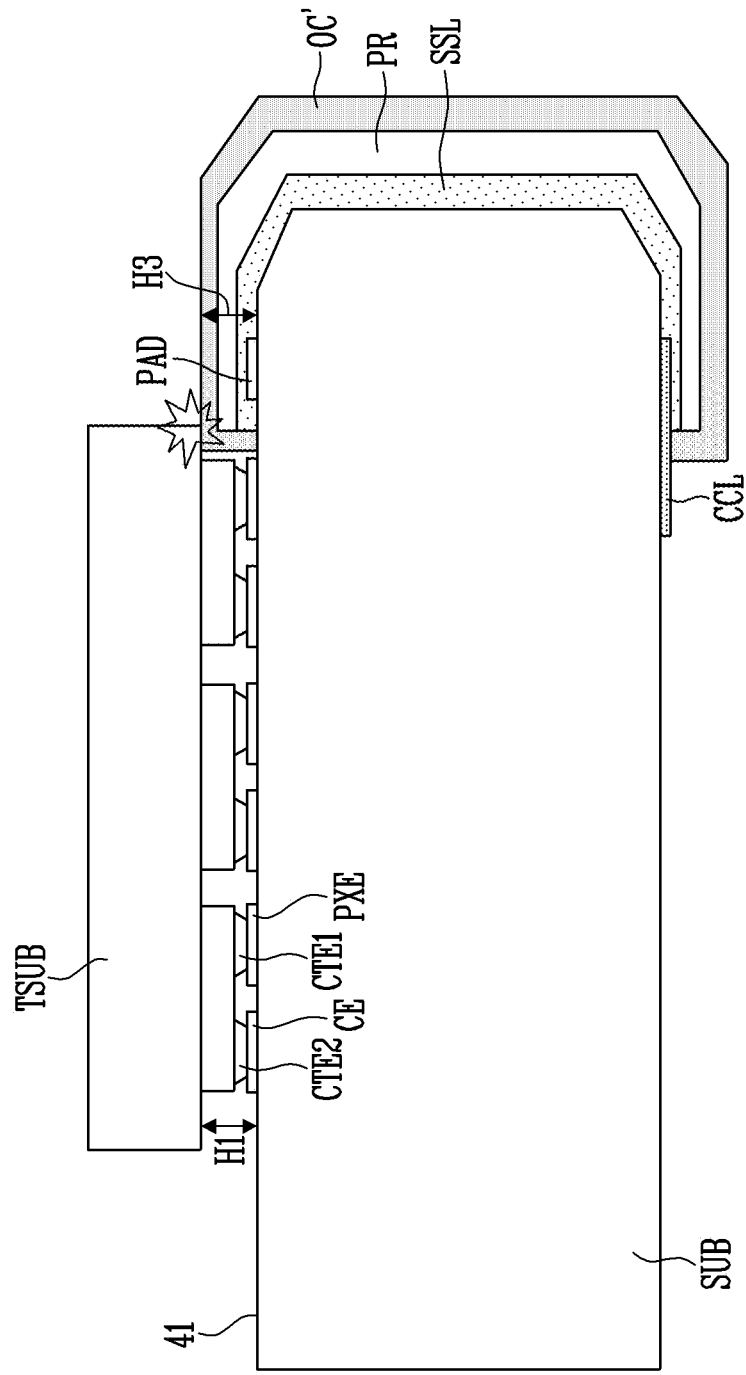
Figure 19B:
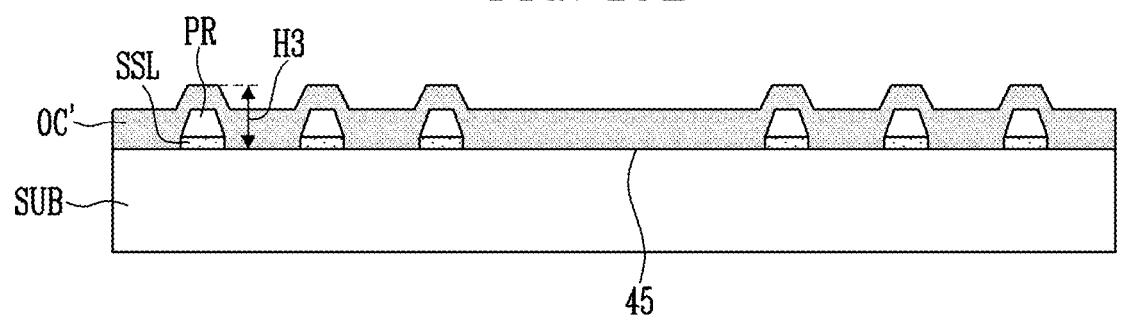

FIGS. 18 to 19B are diagrams illustrating an effect of the disclosure.

Referring to FIG. 18, the light emitting elements LE may be transferred on the pixel electrode PXE and the common electrode CE of the substrate SUB through an electrostatic method using an electrostatic head or a stamp method using a polymer material having elasticity such as polydimethylsiloxane (PDMS) or silicone as a transfer substrate TSUB.

According to an embodiment of the disclosure, when the first coating pattern PR and the second coating pattern OC are formed so as not to overlap generally in the thickness direction, since the second height H2 from the first surface 41 of the substrate SUB to the upper surface of the second coating pattern OC is lower than the first height H1 from the first surface 41 of the substrate SUB to the upper surface of the light emitting element LE, contact failure between the first contact electrode CTE1 of the light emitting element LE and the pixel electrode PXE and/or contact failure between the second contact electrode CTE2 and the common electrode CE may be prevented.

Referring to FIGS. 19A and 19B, when the first coating pattern PR and the second coating pattern OC' completely overlap in the thickness direction, since a third height H3 from the first surface 41 of the substrate SUB to the upper surface of the second coating pattern OC' is higher than the first height H1 (refer to FIG. 18) from the first surface 41 of the substrate SUB to the upper surface of the element LE, contact failure between the first contact electrode CTE1 of the light emitting element LE and the pixel electrode PXE and/or contact failure between the second contact electrode CTE2 and the common electrode CE may occur.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
   light emitting elements disposed on an active area of a substrate;
   pads disposed on a front surface edge area of the substrate, the pads being electrically connected to the light emitting elements;
   connection lines disposed on a rear surface edge area of the substrate; and
   side surface lines electrically connecting respective ones of the pads and the connection lines through a side surface of the substrate, wherein
   an upper surface of the side surface lines is covered by first coating patterns, a side surface of the side surface lines is covered by a second coating pattern that directly contacts the side surface of the side surface lines, and
   the second coating pattern includes openings corresponding to the first coating patterns in a plan view.

2. The display device according to claim 1, wherein a height from a surface of the substrate to an upper surface of the first coating pattern and a height from the surface of the substrate to an upper surface of the second coating pattern are substantially a same height.

3. The display device according to claim 2, wherein the height from the surface of the substrate to the upper surface of the second coating pattern at an edge portion of the first coating pattern is higher than the height from the surface of the substrate to the upper surface of the first coating pattern.

4. The display device according to claim 1, wherein
   a first chamfer surface is disposed at an edge where a front surface of the substrate contacts the side surface of the substrate, and
   a second chamfer surface is disposed at an edge where a rear surface of the substrate contacts the side surface of the substrate.

5. The display device according to claim 1, wherein a height from a surface of the substrate to an upper surface of the light emitting element is higher than a height from the surface of the substrate to an upper surface of the second coating pattern.

6. The display device according to claim 1, wherein the first coating pattern and the second coating pattern include a photoresist and a black pigment.

7. The display device according to claim 1, wherein the light emitting elements are micro light emitting diodes of a flip chip type.

8. The display device according to claim 7, wherein the micro light emitting diodes comprise:
   a base substrate;
   an n-type semiconductor disposed on the base substrate;
   an active layer disposed on a first portion of the n-type semiconductor;
   a p-type semiconductor disposed on a surface of the active layer;
   a first contact electrode disposed on the p-type semiconductor; and
   a second contact electrode disposed on a second portion of the n-type semiconductor.

9. A tiled display device comprising display devices, each of the display devices comprising:
   a substrate;
   light emitting elements disposed on an active area of the substrate;
   pads disposed on a front surface edge area of the substrate, the pads being electrically connected to the light emitting elements;
   connection lines disposed on a rear surface edge area of the substrate; and
   side surface lines electrically connecting respective ones of the pads and the connection lines through a side surface of the substrate, wherein
   an upper surface of the side surface lines is covered by first coating patterns, and a side surface of the side surface lines is covered by a second coating pattern that directly contacts the side surface of the side surface lines, and
   the second coating pattern includes openings corresponding to the first coating patterns in a plan view.

10. The tiled display device according to claim 9, wherein the display devices are arranged in a matrix form.

11. The tiled display device according to claim 10, wherein
   the display devices comprise a first display device, a second display device, a third display device and a fourth display device, and the first display device and the second display device are adjacent to each other in a first direction, the first display device and the third display device are adjacent to each other in a second direction intersecting the first direction, the third display device and the fourth display device are adjacent to each other in the first direction, and the second display device and the fourth display device are adjacent to each other in the second direction.

12. The tiled display device according to claim 9, wherein the display devices are connected to each other by a coupling member or an adhesive member.

13. The tiled display device according to claim 9, wherein a height from a surface of the substrate to an upper surface of the first coating patterns and a height from the surface of the substrate to an upper surface of the second coating pattern are substantially a same height.

14. The tiled display device according to claim 13, wherein the height from the surface of the substrate to the upper surface of the second coating pattern at an edge portion of the first coating patterns is higher than the height from the surface of the substrate to the upper surface of the first coating patterns.

15. The tiled display device according to claim 9, wherein
a first chamfer surface is disposed at an edge where a front surface of the substrate contacts the side surface of the substrate, and
a second chamfer surface is disposed at an edge where a rear surface of the substrate contacts the side surface of the substrate.

16. The tiled display device according to claim 9, wherein a height from a surface of the substrate to an upper surface of the light emitting elements is higher than a height from the surface of the substrate to an upper surface of the second coating pattern.

17. The tiled display device according to claim 9, wherein the first coating patterns and the second coating pattern include a photoresist and a black pigment.

18. The tiled display device according to claim 9, wherein the light emitting elements are micro light emitting diodes of a flip chip type.

19. The tiled display device according to claim 18, wherein the micro light emitting diodes comprise:
a base substrate;
an n-type semiconductor disposed on the base substrate;
an active layer disposed on a first portion of the n-type semiconductor;
a p-type semiconductor disposed on a surface of the active layer;
a first contact electrode disposed on the p-type semiconductor; and
a second contact electrode disposed on a second portion of the n-type semiconductor.

20. The display device according to claim 1, wherein the display device defines a thickness direction, and the connection line overlaps the light emitting elements in the thickness direction.

* * * * *